United States Patent
Brandl et al.

(10) Patent No.: US 11,709,280 B2
(45) Date of Patent: *Jul. 25, 2023

(54) CORRECTION INFORMATION INTEGRITY MONITORING IN NAVIGATION SATELLITE SYSTEM POSITIONING METHODS, SYSTEMS, AND DEVICES

(71) Applicant: Trimble Inc., Sunnyvale, CA (US)

(72) Inventors: Markus Brandl, Höhenkirchen-Siegertsbrunn (DE); Ulrich Weinbach, Höhenkirchen-Siegertsbrunn (DE); Carlos Javier Rodriguez Solano, Höhenkirchen-Siegertsbrunn (DE)

(73) Assignee: Trimble Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/511,430

(22) Filed: Oct. 26, 2021

(65) Prior Publication Data
US 2022/0058322 A1 Feb. 24, 2022

Related U.S. Application Data

(63) Continuation of application No. 16/545,524, filed on Aug. 20, 2019, now Pat. No. 11,187,813.

(30) Foreign Application Priority Data

Sep. 21, 2018 (EP) ..................... 18196017

(51) Int. Cl.
*G06F 30/33* (2020.01)
*G01S 19/44* (2010.01)
(Continued)

(52) U.S. Cl.
CPC .............. *G01S 19/44* (2013.01); *G01S 19/08* (2013.01); *G01S 19/20* (2013.01); *G01S 19/22* (2013.01);
(Continued)

(58) Field of Classification Search
CPC ........ G06F 30/392; G06F 30/33; G06F 30/39; G06F 30/333; G01S 19/44; G01S 19/20; G01S 19/22; G01S 19/40; G01S 19/08
(Continued)

(56) References Cited

U.S. PATENT DOCUMENTS

| 6,067,484 A | 5/2000 | Rowson et al. |
| 6,377,892 B1 | 4/2002 | Johnson et al. |

(Continued)

FOREIGN PATENT DOCUMENTS

| CN | 103430046 A | * 12/2013 | ............. G01S 19/04 |
| CN | 107070533 A | * 8/2017 | ......... H04B 7/18517 |

(Continued)

OTHER PUBLICATIONS

Blomenhofer, H., et al., "GNSS/Galileo Global and Regional Integrity Performance Analysis", Institute of Navigation 2004, pp. 1-10.
(Continued)

*Primary Examiner* — Harry K Liu
(74) *Attorney, Agent, or Firm* — Kilpatrick Townsend & Stockton LLP

(57) ABSTRACT

Some embodiments of the invention relate to generating correction information based on global or regional navigation satellite system (NSS) multiple-frequency signals observed at a network of reference stations, broadcasting the correction information, receiving the correction information at one or more monitoring stations, estimating ambiguities in the carrier phase of the NSS signals observed at the monitoring station(s) using the correction information
(Continued)

received thereat, generating residuals, generating post-broadcast integrity information based thereon, and broadcasting the post-broadcast integrity information. Other embodiments relate to receiving and processing correction information and post-broadcast integrity information at NSS receivers or at devices which may have no NSS receiver, as well as to systems, NSS receivers, devices which may have no NSS receiver, processing centers, and computer programs. Some embodiments may for example be used for safety-critical applications such as highly-automated driving and autonomous driving.

10 Claims, 15 Drawing Sheets

(51) Int. Cl.
| | |
|---|---|
| *G01S 19/40* | (2010.01) |
| *G05D 1/00* | (2006.01) |
| *G01S 19/20* | (2010.01) |
| *G01S 19/08* | (2010.01) |
| *G01S 19/22* | (2010.01) |
| *G06F 30/392* | (2020.01) |
| *G06F 30/39* | (2020.01) |
| *G06F 30/333* | (2020.01) |

(52) U.S. Cl.
CPC ............ *G01S 19/40* (2013.01); *G05D 1/0022* (2013.01); *G05D 1/0088* (2013.01); *G06F 30/33* (2020.01); *G06F 30/333* (2020.01); *G06F 30/39* (2020.01); *G06F 30/392* (2020.01); *G05D 2201/0213* (2013.01)

(58) Field of Classification Search
USPC ......................................................... 714/738
See application file for complete search history.

(56) References Cited

U.S. PATENT DOCUMENTS

| | | | |
|---|---|---|---|
| 8,200,430 | B2 | 6/2012 | Trautenberg et al. |
| 11,187,813 | B2 | 11/2021 | Brandl et al. |
| 2006/0279455 | A1 | 12/2006 | Bird et al. |
| 2011/0181465 | A1 | 7/2011 | Li et al. |
| 2012/0154210 | A1 | 6/2012 | Landau et al. |
| 2012/0154214 | A1 | 6/2012 | Leandro |
| 2012/0162007 | A1 | 6/2012 | Leandro et al. |
| 2012/0163419 | A1 | 6/2012 | Seeger |
| 2013/0044026 | A1 | 2/2013 | Chen et al. |
| 2014/0070988 | A1 | 3/2014 | Peck et al. |
| 2017/0269216 | A1 | 9/2017 | Dai et al. |
| 2018/0238709 | A1 | 8/2018 | Aucoin et al. |
| 2018/0306930 | A1 | 10/2018 | Laine et al. |
| 2022/0252732 | A1* | 8/2022 | Dai ....................... G01S 19/071 |

FOREIGN PATENT DOCUMENTS

| | | | | |
|---|---|---|---|---|
| CN | 108037521 | A | * | 5/2018 |
| CN | 108132013 | A | * | 6/2018 ............... G01B 7/16 |
| EP | 1 637 899 | A1 | | 3/2006 |
| EP | 3 035 080 | A1 | | 6/2016 |
| EP | 3 130 943 | A1 | | 2/2017 |
| WO | 2011/034614 | A2 | | 3/2011 |

OTHER PUBLICATIONS

Blomenhofer, H., et al., "Performance Analysis of GNSS Global and Regional Integrity Concepts", Institute of Navigation 2003, 11 pages.
Blomenhofer, H., et al., "Sensitivity Analysis of the Galileo Integrity Performance Dependent on the Ground Sensor Station Network", ION GNSS 18th International Technical Meeting of the Satellite Division, Sep. 13-16, 2005, Long Beach, CA, pp. 1361-1373.
Bromiley, P. A., "Tutorial: Least-Squares Fitting", Tina Memo No. 2008-005, Last updated Jun. 6, 2008, Imaging Science and Biomedical Engineering Division Medical School, University of Manchester, 12 pages.
Caamano, M., et al., "Multi-constellation GBAS: how to benefit from a second constellation", 2016 IEEE/ION Position, Location and Navigation Symposium (PLANS), ISBN 978-1-5090-2042-3; 9 pages.
Celestino, U., et al., "EGNOS Operations Introduced in Mediterranean Region: MEDUSA", GPS World, Dec. 22, 2014, downloaded _ from https:/www.gpsworld.com/egnos-operations-introduced-in-mediterranean-region-medusa/.
Charbonnieras, C., et al., A New GNSS Integrity Monitoring Based on Channels Joint Characterization, 2016 IEEE/ION Position, Location and Navigation Symposium (PLANS), ISBN 978-1-5090-2042-3, pp. 422-430.
Chen, X., et al., "New Tools for Network RTK Integrity Monitoring", Institute of Navigation 2003, 6 pages.
Chen, X., et al., "Trimble RTX, an Innovative New Approach for Network RTK", 24th International 15 Technical Meeting of the Satellite Division of the Institute of Navigation 2011, ION GNSS 2011, 3: 2214-2219, 6 pages.
Enge, P., et al.,"Wide Area Augmentation of the Global Positioning System", Proceedings of the IEEE, vol. 84, No. 8, Aug. 1996, pp. 1063-1088.
European Patent Office's (EPO) Extended European Search Report for Application No. 18196017.0-1206 issued under cover letter of Mar. 21, 2019, 11 pages.
Fujita, S, et al., "Design of Integrity Function on Centimeter Level Augmentation Service (CLAS) in Japanese Quasi-Zenith Satellite System," Proceedings of the 29th International Technical Meeting of the Satellite Division of the Institute of Navigation (ION GNSS+ 2016), Portland, Oregon, Sep. 2016, pp. 3258-3263.
Green, G. N., et al., "Data-Driven Generalized Integer Aperture Bootstrapping for Real-Time High Integrity Applications", 2016 IEEE/ION Position, Location and Navigation Symposium (PLANS), ISBN 978-1-5090-2042-3, pp. 272-285.
ICAO (2006) Annex 10 to the Convention on Int. Civil Aviation, vol. I Radio Navigation Aids, chapter 3, 129 pages.
Integrity. (Jul. 26, 2018). Navipedia. Retrieved 07:27, downloaded _ from https://gssc.esa.int/navipedia/index.php?title=Integrity&oldid=14073 ., 5 pages.
Reusssner, N., et al., "Integrity of the Trimble RTX GNSS Correction Service"—Abstract only, ION 2018, abstract submitted (Jun. 2018) inter alia by the inventors.
Jokinen, A., et al., "Integrity monitoring of fixed ambiguity Precise Point Positioning (PPP) solutions", Geo-spatial Information Science, 16:3, pp. 141-148, published online: Aug. 13, 2013.
Larson, J., et al., "Analysis and Utilization of Extreme Value Theory for Conservative Overbounding", 2016 IEEE/ION Position, Location and Navigation Symposium (PLANS), 10 pages.
Montefusco, C., et al., "Assessment of EGNOS performance in worst ionosphere conditions (Oct. and Nov. 2003 storm)", European Navigation Conference 2005—Munich, 10 pages.
Oehler, V., et al., "The Galileo Integrity Concept and Performance", Proceedings to the 18th ION GNSS International Technical Meeting of the Satellite Division, Sep. 2005, 11 pages.
Paternostro, S., et al., "Evaluation of Advanced Receiver Autonomous Integrity Monitoring Performance on Predicted Aircraft Trajectories", 2016 IEEE/ION Position, Location and Navigation Symposium (PLANS), pp. 842-856.
Rodriguez, I., et al., "Satellite Autonomous Integrity Monitoring (SAIM) for GNSS Systems", Proceedings of the 22nd International Technical Meeting of the Satellite Division of the Institute of Navigation (ION GNSS 2009), Savannah, GA, Sep. 2009, pp. 1330-1342.
Roturier, B., et al. "The SBAS Integrity Concept Standardised by ICAO. Application to EGNOS", Dec. 2006, 7 pages.

(56) References Cited

OTHER PUBLICATIONS

Tellinghuisen, J., "Statistical Error Propagation", The Journal of Physical Chemistry A, American Chemical Society, 2001, 105, pp. 3917-3921.

Tossaint, M., et al. "The Stanford-ESA Integrity Diagram: A New Tool for the User Domain SBAS Integrity Assessment", Navigation: Journal of the Institute of Navigation, vol. 54, No. 2, Summer 2007, pp. 153-162.

"Trimble Alloy GNSS Reference Receiver", 2 pages retrieved on Nov. 26, 2019 from https://www.trimble.com/Infrastructure/Trimble-Alloy.aspx.

"Trimble Positioning for Automotive Applications," 2018, Trimble Inc. 5 Pages, Retrieved on Jun. 2018 from http://www.trimble.com/Positioning-Services/pdf/022517-202_Trimble_Automotive_BRO_US_0118.pdf.

"Trimble Zephyr 3 Geodetic Antenna", retrieved on Aug. 7, 2018 from https://www.trimble.com/Infrastructure/Trimble-Zephyr-Geodetic-Antenna.aspx.

Walter, T., et al., "Determination of Fault Probabilities for ARAIM", 2016 IEEE/ION Position, Location and Navigation Symposium (PLANS), 11 pages.

Walter, T., et al., "Integrity Lessons from the WAAS Integrity Performance Panel", Global Navigation Satellite Systems: Report of a Joint Workshop of the National Academy of Engineering and the Chinese Academy of Engineering, 2012, 22 pages, downloaded Nov. 26, 2019.

Walter, T., et al., "Treatment of Biased Error Distributions in SBAS", Journal of Global Positioning Systems (2004), vol. 3, No. 1-2: pp. 265-272.

Wezka, K., et al., "Reliability Monitoring of GNSS Observables under Influence of Ionospheric Disturbances", 2016 IEEE/ION Position, Location and Navigation Symposium (PLANS), pp. 431-441.

Westbrook, J., et al., "EGNOS Central Processing Facility architecture and design", GNSS 2000 Conference, May 2000, pp. 1-17.

Wörner, M., et al., "Integrity for Autonomous Driving: A Survey", 2016 IEEE/ION Position, Location and Navigation Symposium (PLANS), pp. 666-671.

U.S. Appl. No. 16/545,524 Non-Final Office Action dated Apr. 26, 2021, 8 pages.

U.S. Appl. No. 16/545,524 Notice of Allowance dated Jul. 28, 2021, 5 pages.

* cited by examiner

CORRECTION INFORMATION INTEGRITY MONITORING IN NAVIGATION SATELLITE SYSTEM POSITIONING METHODS, SYSTEMS, AND DEVICES

CROSS-REFERENCE TO RELATED APPLICATIONS

The present application is a continuation of U.S. application Ser. No. 16/545,524, filed Aug. 20, 2019, which claims priority to European Application No. EP18196017.0, filed Sep. 21, 2018, the contents of which are incorporated herein by reference in their entirety for all purposes.

FIELD OF TECHNOLOGY

The invention relates to methods, systems, devices, and computer programs for generating, broadcasting, and making use of integrity information associated with correction information generated for use in global or regional navigation satellite systems (NSS) position estimation. The fields of application of these methods, systems, devices, and computer programs include, but are not limited to, navigation, transportation, highly-automated driving, autonomous driving, map-making, land surveying, civil engineering, agriculture, disaster prevention and relief, and scientific research.

BACKGROUND

Navigation satellite systems (NSS) include both global navigation satellite systems (GNSS) and regional navigation satellite systems (RNSS), such as the Global Positioning System (GPS) (United States), GLONASS (Russia), Galileo (Europe), BeiDou (China), QZSS (Japan), and the Indian Regional Navigational Satellite System (IRNSS) (systems in use or in development). An NSS typically uses a plurality of satellites orbiting the Earth. The plurality of satellites forms a constellation of satellites. An NSS receiver detects a code modulated on an electromagnetic signal broadcast by a satellite. The code is also called a ranging code. Code detection includes comparing the bit sequence modulated on the broadcasted signal with a receiver-side version of the code to be detected. Based on the detection of the time of arrival of the code for each of a series of the satellites, the NSS receiver estimates its position. Positioning includes, but is not limited to, geolocation, i.e. the positioning on the surface of the Earth.

An overview of GPS, GLONASS and Galileo is provided for instance in sections 9, 10 and 11 of reference [1] (a list of references is provided at the end of the present description).

Positioning using NSS signal codes provides a limited accuracy, notably due to the distortion the code is subject to upon transmission through the atmosphere. For instance, the GPS includes the transmission of a coarse/acquisition (C/A) code at about 1575 MHz, the so-called L1 frequency. This code is freely available to the public, whereas the Precise (P) code is reserved for military applications. The accuracy of code-based positioning using the GPS C/A code is approximately 15 meters, when taking into account both the electronic uncertainty associated with the detection of the C/A code (electronic detection of the time of arrival of the pseudorandom code) and other errors including those caused by ionospheric and tropospheric effects, ephemeris errors, satellite clock errors, and multipath propagation.

An alternative to positioning based on the detection of a code is positioning based on carrier phase measurements. In this alternative approach or additional approach (ranging codes and carrier phases can be used together for positioning), the carrier phase of the NSS signal transmitted from the NSS satellite is detected, not (or not only) the code modulated on the signal transmitted from the satellite.

The approach based on carrier phase measurements has the potential to provide much greater position precision, i.e. down to centimetre-level or even millimetre-level precision, compared to the code-based approach. The reason may be intuitively understood as follows. The code, such as the GPS C/A code on the L1 band, is much longer than one cycle of the carrier on which the code is modulated. The position resolution may therefore be viewed as greater for carrier phase detection than for code detection.

However, in the process of estimating the position based on carrier phase measurements, the carrier phases are ambiguous by an unknown number of cycles. The phase of a received signal can be determined, but the number of cycles cannot be directly determined in an unambiguous manner. This is the so-called "integer ambiguity problem", "integer ambiguity resolution problem" or "phase ambiguity resolution problem", which may be solved to yield the so-called fixed solution.

GNSS observation equations for code observations and for carrier phase observations are for instance provided in ref. [1], section 5. An introduction to the GNSS integer ambiguity resolution problem, and its conventional solutions, is provided in ref. [1], section 7.2. The skilled person will recognize that the same or similar principles apply to RNSS systems.

The main GNSS observables are therefore the carrier phase and code (pseudorange), the former being much more precise than the latter, but ambiguous. These observables enable a user to obtain the geometric distance from the receiver to the satellite. With known satellite position and satellite clock error, the receiver position can be estimated.

As mentioned above, the GPS includes the transmission of a C/A code at about 1575 MHz, the so-called L1 frequency. More precisely, each GPS satellite transmits continuously using two radio frequencies in the L-band, referred to as L1 and L2, at respective frequencies of 1575.42 MHz and 1227.60 MHz. With the ongoing modernization of the GPS, signals on a third L5 frequency are becoming available. Among the two signals transmitted on L1, one is for civil users and the other is for users authorized by the United States Department of Defense (DoD). Signals are also transmitted on L2, for civil users and DoD-authorized users. Each GPS signal at the L1 and L2 frequencies is modulated with a pseudo-random number (PRN) code, and with satellite navigation data. Two different PRN codes are transmitted by each satellite: a C/A code and a P code which is encrypted for DoD-authorized users. Each C/A code is a unique sequence of 1023 bits, which is repeated each millisecond. Other NSS systems also have satellites transmitting multiple signals on multiple carrier frequencies.

Embodiments described in reference [2] generate synthetic base station data preserving the integer nature of carrier phase data. A set of corrections is computed per satellite (a dual frequency code-carrier observation bias commonly referred to as Melbourne-Wübbena (MW) bias, precise satellite positions, a code-leveled clock error and a phase-leveled clock error) from global network data. Using these corrections, a rover station can use the MW-combination to determine widelane (WL) ambiguities and use ionospheric-free phase observations to determine the N1 (narrowlane) ambiguities. With the determined ambiguities, the rover station can achieve centimeter-level accuracy positioning in real-time. The advantage of this approach is that it is insensitive to ionospheric activity; the disadvantage is that the convergence time is longer than desired.

In order to reduce the convergence time, reference [3] describes a method making use of an ionosphere model and further deriving an ionospheric-phase bias per satellite in addition to other corrections (a MW-bias, a code-leveled clock error and a phase-leveled clock error) to generate synthetic base station data. The synthetic base station data generated with this approach preserves the integer nature of carrier phase data, and it can be used for both single and dual frequency rover stations. This approach requires an ionosphere model. The convergence time can be further reduced if an improved ionosphere model based on a regional network of reference stations is used.

To reduce the convergence time of the positioning solution too, reference [4] relates to the generation and provision of regionally-applicable correction information (i.e., regional correction information) for use for example by PPP applications. The regional correction information represents regional ionosphere correction models. There is one regional ionosphere correction model per satellite. The regional correction information may optionally be accompanied by accuracy-indicating information to expressly indicate the accuracy of the regional correction information.

Further, and also to reduce the convergence time of the positioning solution, reference [5] relates to the generation and provision of regionally-applicable tropospheric correction information (i.e., regional tropospheric correction information) for use for example by PPP applications.

The provision of integrity information in a NSS context is known from reference [6], which relates to integrity functions for the Centimeter Level Augmentation Service (CLAS) in QZSS. The system provides "warnings to users when the service should not be used", within a time to alert (TTA), which the "time period between an occurrence of a service error and the time it reaches a user receiver". In particular, a 1-bit alert flag is set depending in the number of detected satellite anomalies and GNSS system anomalies (see, in ref. [6], Tables 1 and 2).

Besides, in a different accuracy category, i.e. using smoothed pseudoranges rather than estimating the ambiguities in the carrier phases of the observed NSS signals, reference [7] relates to the provision of integrity information in the European Geostationary Navigation Overlay Service (EGNOS). A so-called "Central Processing Facility" (CPF) "provides the corrections and integrity information that are broadcast over the EGNOS service area".

There is a constant need for improving the implementation of positioning systems based notably on GNSS (or RNSS) measurements, to obtain a precise and reliable estimation of the receiver position, in particular in the context of safety-critical applications such as for example highly-automated driving and autonomous driving.

SUMMARY

The present invention aims at addressing the above-mentioned need. The invention includes methods, systems, NSS receivers, devices, processing centers, computer programs, computer program products and storage mediums as defined in the independent claims. Particular embodiments are defined in the dependent claims.

In one embodiment, a method is provided for generating, on the one hand, information (here referred to as "correction information") suitable for correcting observations useful for estimating (i) carrier phase ambiguities and/or (ii) a position of a global and/or regional NSS receiver, and, on the other hand, further information (here referred to as "integrity information"), suitable for indicating a trust which can be placed in a correctness of the correction information. The method comprises:

At a computer or set of computers (the computer or set of computers being here collectively referred to as "processing center"), correction information is generated based on NSS multiple-frequency signals observed at a network of reference stations, each of the reference stations having a NSS receiver, and based on estimating ambiguities in the carrier phase of the NSS signals observed at the network of reference stations. The generated correction information comprises at least one of: (a) satellite orbit correction information, (b) satellite clock correction information, (c) ionospheric correction information, and (d) tropospheric correction information. The correction information is broadcast by the processing center at a first point in time.

At each of at least one monitoring station, each monitoring station having a NSS receiver, NSS multiple-frequency signals from a plurality of NSS satellites are observed over multiple epochs, and the correction information is also received from the processing center.

Ambiguities in the carrier phase of the NSS signals observed at the at least one monitoring station are then estimated using the correction information received at each of the at least one monitoring station. Residuals are generated based on at least: (1) the NSS signals observed at each of the at least one monitoring station, (2) the estimated ambiguities, (3) a known position (here referred to as "reference position"), of each of the at least one monitoring station, and (4) the correction information received at each of the at least one monitoring station.

At the processing center, integrity information (here referred to as "post-broadcast integrity information") is then generated. Generating the post-broadcast integrity information comprises comparing the generated residuals with quality indicators of the correction information received at each of the at least one monitoring station. The processing center then broadcasts, at a second point in time after the first point in time, the post-broadcast integrity information.

The method enables to inform devices using broadcasted correction information, generated based on estimating ambiguities in the carrier phase of NSS signals observed at a network of reference stations, that the correction information integrity is or may be violated. The post-broadcast integrity information relating to the broadcasted correction information is derived from the correction information received at one or more monitoring station(s), and used for estimating ambiguities in the carrier phase of the NSS signals observed at the monitoring station(s). Problems arising in the context of broadcasting, however rare these problems may be, can therefore be accounted for in the post-broadcast integrity information. The post-broadcast integrity information is broadcast after broadcasting the correction information, such as for example a few seconds thereafter.

The invention also relates, in one embodiment, to a method comprising: observing, by a global or regional NSS receiver, NSS signals from a plurality of NSS satellites over multiple epochs, or obtaining such observed signals; receiving, at a first point in time, information, here referred to as "correction information", suitable for correcting observations useful for estimating (i) carrier phase ambiguities and/or (ii) a position of at least one NSS receiver, wherein the correction information comprises at least one of: (a) satellite orbit correction information, (b) satellite clock correction information, (c) ionospheric correction information, and (d) tropospheric correction information; refraining, for at least one application configured for potentially making use of the correction information, from using (1) the correction information, or (2) ambiguities in the carrier phase of the observed NSS signals, estimated using the correction information, or at least (3) a positioning solution computed using said estimated ambiguities, at least until receiving, at a second point in time after the first point in time, information, here referred to as "post-broadcast integrity information", indicating that a sufficient trust can be placed in a correctness of the correction information received at the first point in time; and, after post-broadcast integrity information has been received, which indicates that a sufficient trust can be placed in the correctness of the correction information received at the first point in time, estimating ambiguities in the carrier phase of the observed signals using the correction information received at the first point in time, or, if ambiguities had already been estimated, using the estimated ambiguities or using the positioning solution computed based thereon.

The invention also relates, in one embodiment, to a method for conditionally forwarding information, here referred to as "correction information", suitable for correcting observations useful for estimating: (i) carrier phase ambiguities and/or (ii) a position of at least one global or regional NSS receiver. The method comprises: receiving, at a first point in time, correction information comprising at least one of: (a) satellite orbit correction information, (b) satellite clock correction information, (c) ionospheric correction information, and (d) tropospheric correction information; refraining from forwarding the correction information at least until receiving, at a second point in time after the first point in time, information, here referred to as "post-broadcast integrity information", indicating that a sufficient trust can be placed in a correctness of the correction information received at the first point in time; and, after post-broadcast integrity information has been received, which indicates that a sufficient trust can be placed in the correctness of the correction information received at the first point in time, forwarding the correction information received at the first point in time.

The invention also relates to a method carried out by a processing center, as described above, for generating correction information and post-broadcast integrity information. The invention further relates to a system for generating correction information and post-broadcast integrity information, a NSS receiver for receiving the correction information and operating depending on the receipt of, or lack of receipt of, post-broadcast integrity information, a device for receiving the correction information and conditionally forwarding it depending on the receipt of post-broadcast integrity information, and a processing center for generating correction information and post-broadcast integrity information. The invention also relates to computer programs, computer program products storing said computer programs, and storage mediums storing said computer programs, for carrying out, when executed on a computer or a set of computers, a method as described above.

BRIEF DESCRIPTION OF THE DRAWINGS

Embodiments of the present invention shall now be described, in conjunction with the appended drawings in which.

DETAILED DESCRIPTION

The present invention shall now be described in conjunction with specific embodiments. The specific embodiments serve to provide the skilled person with a better understanding, but are not intended to in any way restrict the scope of the invention, which is defined by appended claims. In particular, the embodiments described independently throughout the description can be combined to form further embodiments to the extent that they are not mutually exclusive. Further, whenever possible, steps of methods and flowcharts can be rearranged or be performed concurrently to form further embodiments.

Throughout the following detailed description, the abbreviation "GNSS" is sometimes used. The invention is, however, not limited to global navigation satellite systems (GNSS) but also applies to regional navigation satellite systems (RNSS). Thus, it is to be understood that each occurrence of "GNSS" in the following can be replaced by "RNSS" to form additional embodiments.

When the term "real-time" is used in the present document, this means that there is an action (e.g., data is processed, results are computed, information is broadcast) as soon as the required information for that action is available. Thus, certain latency exists, which depends on various aspects of the involved component(s) of the system.

When the term "troposphere" or "tropospheric" is used in the present document, in particular, but not only, when it comes to accounting for the effects the troposphere has on a NSS signal in terms of the delay affecting the NSS signal, this is meant to also include any effect of the other constituents of the non-ionized atmosphere, i.e. of the neutral atmosphere, such as effects of the stratosphere. For conciseness, and because the effects of the troposphere are dominant, it is therefore referred to the effects of the troposphere to mean both the effects of the troposphere and the stratosphere.

When the term "broadcast" (or "broadcasting", etc.) is used in the present document, it is meant to also cover embodiments where the transmission is carried out by multicasting, i.e. wherein the transmitter knows and uses the recipients' address, such as e.g. network address. This applies to the correction information, the pre-broadcast integrity information, and the post-broadcast integrity information.

Figure 1:
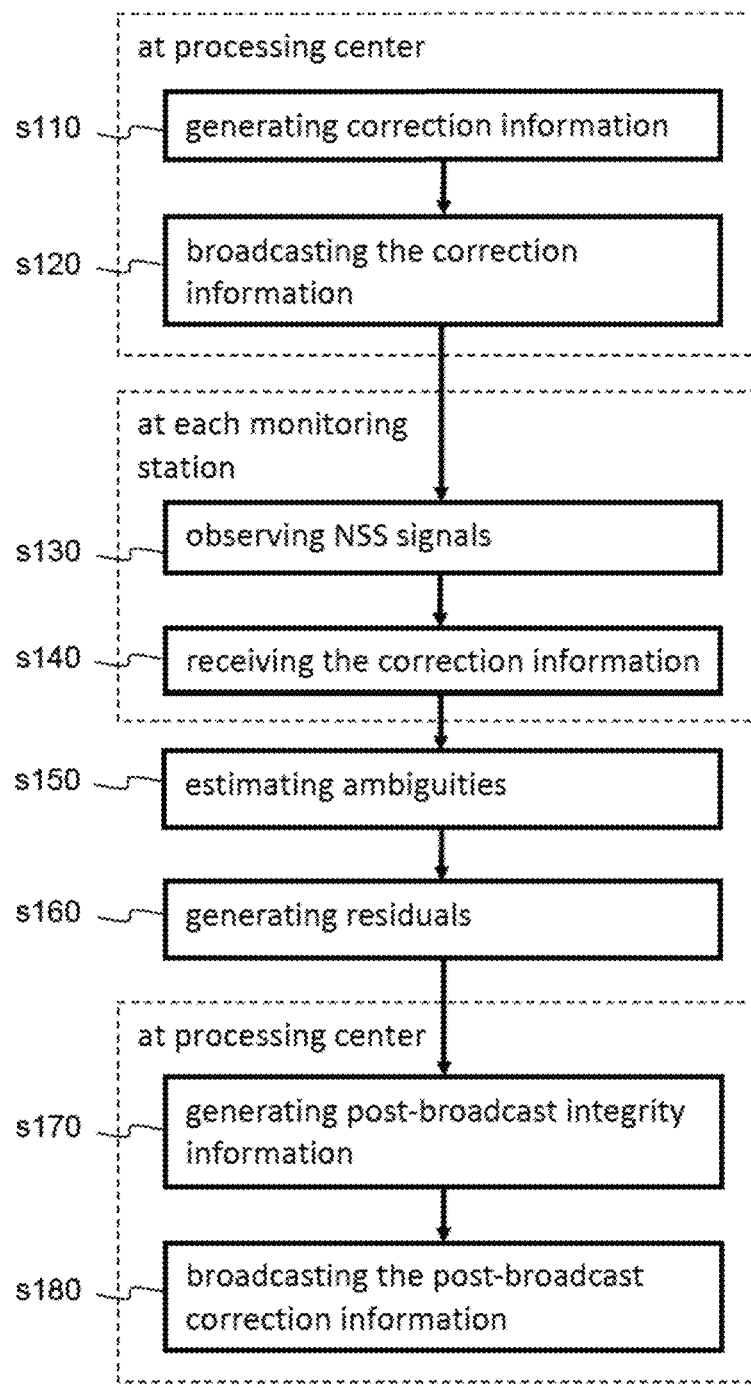
FIG. 1 is a flowchart of a method in one embodiment of the invention.

FIG. 1 is a flowchart of a method in one embodiment of the invention. The method aims, first, at automatically generating correction information, i.e. information suitable for correcting observations useful for estimating: (i) carrier phase ambiguities and/or (ii) a position of a NSS (i.e. GNSS and/or RNSS) receiver, such as the position of a rover receiver or reference station. The NSS receiver(s) may be static or moving. The correction information may eventually be used in a method leading to estimating the rover position or reference station position, i.e. the position of the NSS receiver. If the position of NSS receivers (such as reference stations) is already known, estimating the carrier phase ambiguities or, in particular, resolving the carrier phase ambiguities by solving observation equations (to output a so-called fixed solution), may also be used to eventually estimate the position of a satellite. Second, the method also aims at automatically generating integrity information, i.e. information suitable for indicating a trust which can be placed in a correctness of correction information. In one embodiment, indicating a trust comprises indicating whether, or the extent to which, the correction information is likely to be correct.

The method comprises, at a so-called "processing center" comprising a computer or set of computers (e.g., interconnected computers), generating, in step s110, correction information based on NSS multiple-frequency signals observed at a network of reference stations, and on estimating ambiguities in the carrier phase of said NSS signals observed at the network of reference stations (or, in one embodiment, based on resolving ambiguities in the carrier phase of the NSS signals observed at the network of reference stations). Each reference station has a NSS receiver connected to a NSS antenna. The network of reference stations may be a regional or global network of reference stations. The processing center may therefore be regarded as a global or regional correction service computing center. A reference station is observing NSS signals transmitted over distinct frequencies, such as for example a NSS signal transmitted on the L1 frequency and another transmitted on the L2 frequency. The frequencies are, however, not limited to the L1 and L2 frequencies. For example, a reference station may additionally (or instead of NSS signals on the L1 or L2 frequency) observe a NSS signal transmitted on the L5 frequency. Furthermore, NSS signals are not limited to GPS signals, i.e. NSS signals from other satellite systems may be observed.

The generated correction information comprises at least one of: (a) satellite orbit correction information comprising information about the position, i.e. orbit, of NSS satellite(s), (b) satellite clock correction information comprising information about the clock of NSS satellite(s), (c) ionospheric correction information comprising data representing effects of the ionosphere on the NSS signals transmission, and (d) tropospheric correction information comprising data representing effects of the troposphere on the NSS signals transmission. The generated correction information may therefore comprise any combination of the above elements: i.e. element (a); element (b); element (c); element (d); elements (a) and (b); elements (a) and (c); elements (a) and (d);

elements (b) and (c); elements (b) and (d); elements (c) and (d); elements (a), (b) and (c); elements (a), (b) and (d); elements (a), (c) and (d); elements (b), (c) and (d); or elements (a), (b), (c), and (d). For example, in one embodiment, the generated correction information comprises (a) satellite orbit correction information and (b) satellite clock correction information. Furthermore, the ionospheric and tropospheric correction information may be, or may be regarded as, regional ionospheric and tropospheric correction information respectively, i.e. applicable only to a specific region of the Earth. The generated correction information may also comprise further elements, such as satellite code or phase biases.

An exemplary way to compute the correction information based on dual frequency NSS code and carrier phase observations comprises first estimating the MW biases (see reference [11]), then estimating precise orbits of the NSS satellites (see reference [12]) and finally using the MW biases and the precise orbit information to compute code-leveled satellite clock estimates and phase-leveled clock estimates with fixed integer carrier phase ambiguities (see reference [13]). In addition, regional or global atmospheric corrections may be computed using the aforementioned corrections and the NSS observations of global or dense regional network of reference station receivers (see ref. [4] and [5]).

In step s120, the processing center broadcasts the correction information. The point in time at which a specific piece of correction information is broadcast is referred to as "first point in time". The correction information may for example be broadcast in the form of data packets, such as IP packets, through, for example, any one of, or a combination of, the Internet (e.g. using NTRIP streaming protocol), a cellular network, and a satellite link (e.g. using the L-band). In one embodiment, the correction information is broadcast in real-time, i.e. as soon as available (in line with the abovementioned definition of the term "real-time"). In one embodiment, the correction information is broadcast as a data stream in that messages containing the correction information are broadcast at regular or irregular intervals through the same communication medium or channel. The correction information may be encoded and/or encrypted prior to broadcasting.

The correction information broadcasted by the processing center comprises, or is accompanied by, quality indicators (e.g. as part of the correction stream). Quality indicators describe the estimated accuracy of the corresponding correction information. For example, quality indicators may be provided for any one of, or any combination of: satellite orbit correction information, satellite clock correction information, ionospheric correction information, tropospheric correction information, and satellite code and phase bias corrections. Quality indicators are provided for pieces of correction information whose accuracy has been checked. A quality indicator may for example be provided in the form of a flag (e.g., "Good" or "DoNotUse") and/or in the form of a numerical value describing a zero-mean normal distribution (e.g., variance or standard deviation). If a quality indicator is provided in the form of a numerical value, the quality indicator may, in one embodiment, be expressed in the same unit (e.g., meter) as the unit of the correction information to which the quality indicator relates. If a quality indicator is provided in the form of a flag, the quality indicator may, in one embodiment, be converted (for example using a lookup table) into a numerical value so that it can be compared to the residuals (as will be explained further below). For example, a quality indicator flag "Good" may mean "better than 20 cm".

Further, some quality indicators may be correlated, such as the quality indicators for the satellite clock correction information and for the satellite orbit correction information. If these quality indicators are provided individually, they may, in one embodiment, have to be combined by the receiver of the correction stream in order to describe the expected accuracy of the residual errors after applying correction information to GNSS measurements.

In one embodiment, the frequency at which the correction information is broadcast, which is also called the update rate, depends on the type of correction information. For example, the satellite orbit correction information may be broadcast every 5, 20, or 40 seconds; the satellite clock correction information may be broadcast every 1, 2, or 10 seconds; and the ionospheric and tropospheric correction information may be broadcast every 5, 10, or 40 seconds. Other types of correction information such as satellite biases may for example be broadcast every 30, 60, or 120 seconds.

The broadcasted correction information may be received by rover receivers in the field. It is also received by one or more monitoring stations, which participate in generating post-broadcast integrity information. Each monitoring station has a NSS receiver associated with a NSS antenna. In one embodiment, each monitoring station is a geodetic-grade monitoring station. A superior station setup may for example be selected for the monitoring stations in terms of at least one of: location (low multipath and good satellite visibility), hardware (e.g. using a Trimble Alloy GNSS receiver available from Trimble Inc., Westminster, Colo., USA, as described in reference [9], and a Zephyr 3 Geodetic antenna, as described in reference [10]), software, and connectivity (e.g. redundant internet).

In one embodiment, lower-grade monitoring stations, which do not necessarily have the ability to observe all transmitted GNSS signals, may also be used instead or in combination with geodetic-grade monitoring stations. For example the same type of NSS receiver may be used as monitoring stations and rover receivers.

In one embodiment, the method relies on, i.e. involves, a single monitoring station. Using a single monitoring station may for example suffice for a system providing post-broadcast integrity information to a city or region.

In another embodiment, the method relies on, i.e. involves, a plurality of monitoring stations, such as for example 2, 3, 4, 5, 7, 10, 15, 20, 30, 50, 100, 150, or 200 monitoring stations. In one embodiment, about 20 monitoring stations are used to cover North America and 20 monitoring stations to cover Europe.

In one embodiment, the monitoring station(s) is, or are, independent from the network of reference stations. This means, in one embodiment, that a monitoring station is not collocated with any of the reference stations. That is, none of the monitoring station(s) is used for generating the correction information. In another embodiment, this means that at least one monitoring station is collocated with one of the reference stations but a monitoring station and a reference station do not share the same NSS antenna. In yet another embodiment, this means that at least one monitoring station is collocated with one of the reference stations and shares the same NSS antenna therewith, but a monitoring station and a reference station do not share the same NSS receiver. The independence of the monitoring stations from the network of reference stations is advantageous to guarantee the independence of the NSS observations relied upon (for generating, on the one hand, the correction information and, on the other hand, the post-broadcast integrity information), or at least, if the same NSS antenna is used, an independent processing of the NSS observations.

In step s130, each monitoring station observes NSS multiple-frequency signals from a plurality of NSS satellites over multiple epochs. That is, the monitoring stations are observing NSS signals transmitted over distinct frequencies, such as for example a NSS signal transmitted on the L1 frequency and another transmitted on the L2 frequency. In one embodiment, each monitoring station observes dual-frequency code and carrier phase observations.

Each monitoring station also receives, in step s140, the broadcasted correction information from the processing center. This is the same correction information that is received by rover receivers in the field and transmitted through the same channels.

In step s150, ambiguities in the carrier phase of the NSS signals observed at the monitoring station(s) are then estimated using the correction information received at each monitoring station. In one embodiment, the ambiguities are determined by first resolving the so-called widelane (WL) ambiguity which is the difference between the carrier phase ambiguities of the first and second frequencies L1 and L2. Since the wavelength of the WL ambiguity for all common GNSS is at least four times as large as the L1 ambiguity, it is much easier to determine this ambiguity. The computation may e.g. be done using the MW combination, which is a geometry-free and ionosphere-free code-carrier linear combination making use of the MW satellite bias from the correction data and eliminating the MW receiver bias by forming single differences. When the WL ambiguity is known, it may be used to correct the observation residuals to form an ionosphere-free carrier phase observable containing only the L1 ambiguity with the so-called narrowlane (NL) wavelength lambda_NL=c/($f_{L1}$+$f_{L2}$) (wherein c is the speed of light, $f_{L1}$ is the L1 frequency, and $f_{L2}$ is the L2 frequency). Using this combination, a least-squares parameter estimation is performed which yields, in addition to the receiver position (if unknown), receiver clock offset and a tropospheric delay parameter, float (non-integer) estimates of the carrier phase ambiguities. Using these float estimates together with their corresponding variance-covariance matrix, an integer search algorithm is carried out, that results in a set of integer values (fixed or resolved) ambiguities. Finally, the fixed ambiguities may be used to constrain the float solution and subsequently improve the integer search in an iterative process (see reference [14]).

In one embodiment, the ambiguities are estimated without being resolved, resulting in a float solution. In another embodiment, the ambiguities are resolved, resulting in a fixed solution. The terms "float solution" and "fixed solution" are known to skilled persons in the art. The fixed solution exploits the integer nature of the ambiguities (integer number of cycles) but receiver and satellite biases should be known with high accuracy, and, furthermore, the risk of fixing to the wrong integer exists. The "float" solution is less precise and takes longer to converge than the "fixed" one, but has the advantage of not relying on known biases and has no risk of fixing to the wrong integer.

In step s160, residuals are then generated based on at least: (1) the NSS signals observed at the monitoring station(s), (2) the ambiguities estimated in step s150, (3) a known position, hereinafter referred to as "reference position", of each of the monitoring station(s), and (4) the correction information received at the monitoring station(s).

The reference position is, in one embodiment "(E1)", a priori station coordinates (computed externally) which are used for the ambiguity resolution; in another embodiment "(E2)", station coordinates which are estimated together with the ambiguities; or, in yet another embodiment "(E3)", station coordinates which are smoothed or filtered over time from the coordinates obtained in embodiment (E2). In each of the three embodiments, those station coordinates are the ones used for the residual computation and therefore called "reference position".

In particular, in step s160, the reference position is used to compute the geometric distance between the satellite position, provided as part of the correction data, and the monitoring station which is required to compute the residuals relating to the geometric corrections, such as satellite positions, and satellite clock offsets. This is further explained below, notably with reference to equations discussed after the description part relating to FIG. 6.

Figure 2A:
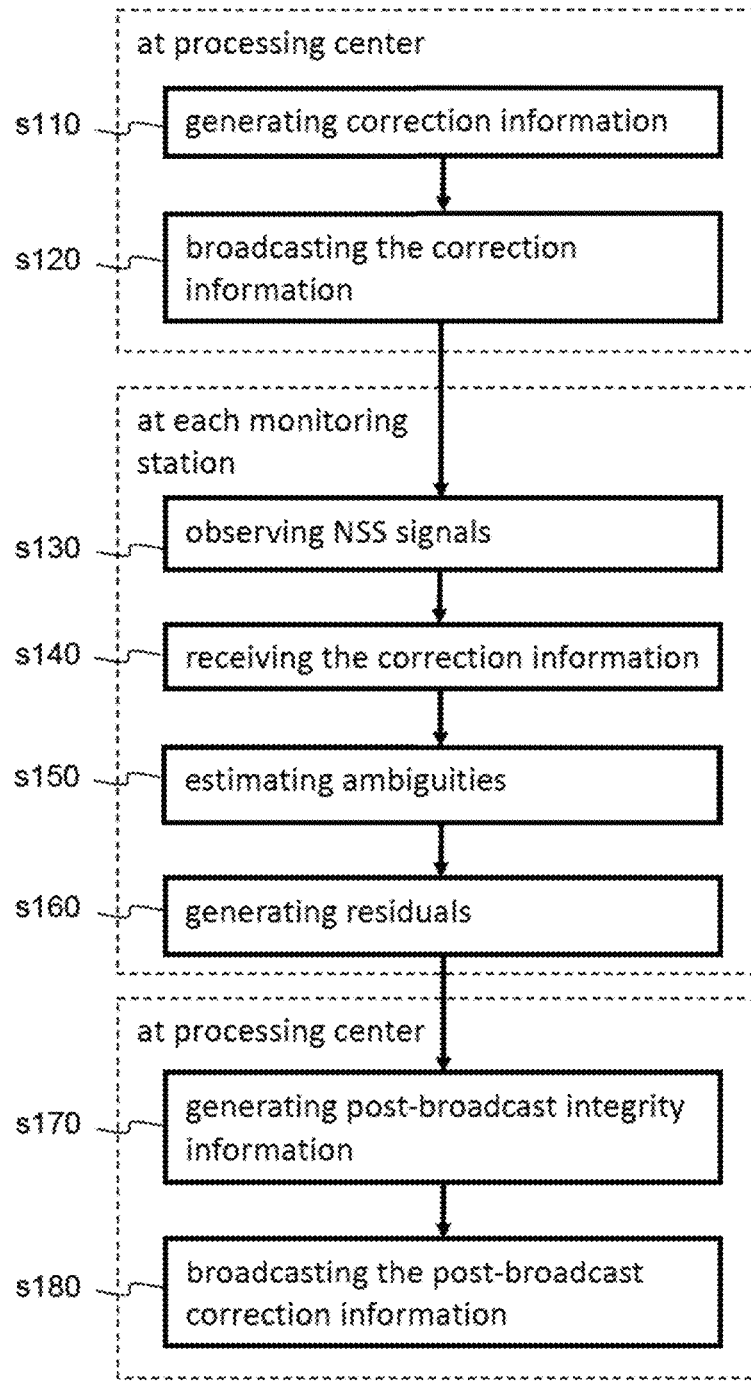
FIG. 2a is a flowchart of a method in one embodiment of the invention, wherein step s150 of estimating ambiguities and step s160 of generating residuals are performed at a monitoring station or, if there are more than one monitoring station, at each monitoring station.

In one embodiment, schematically illustrated by FIG. 2a, steps s150 and s160 are performed at the monitoring station(s), and the residuals are then transmitted to the processing center.

Figure 2B:
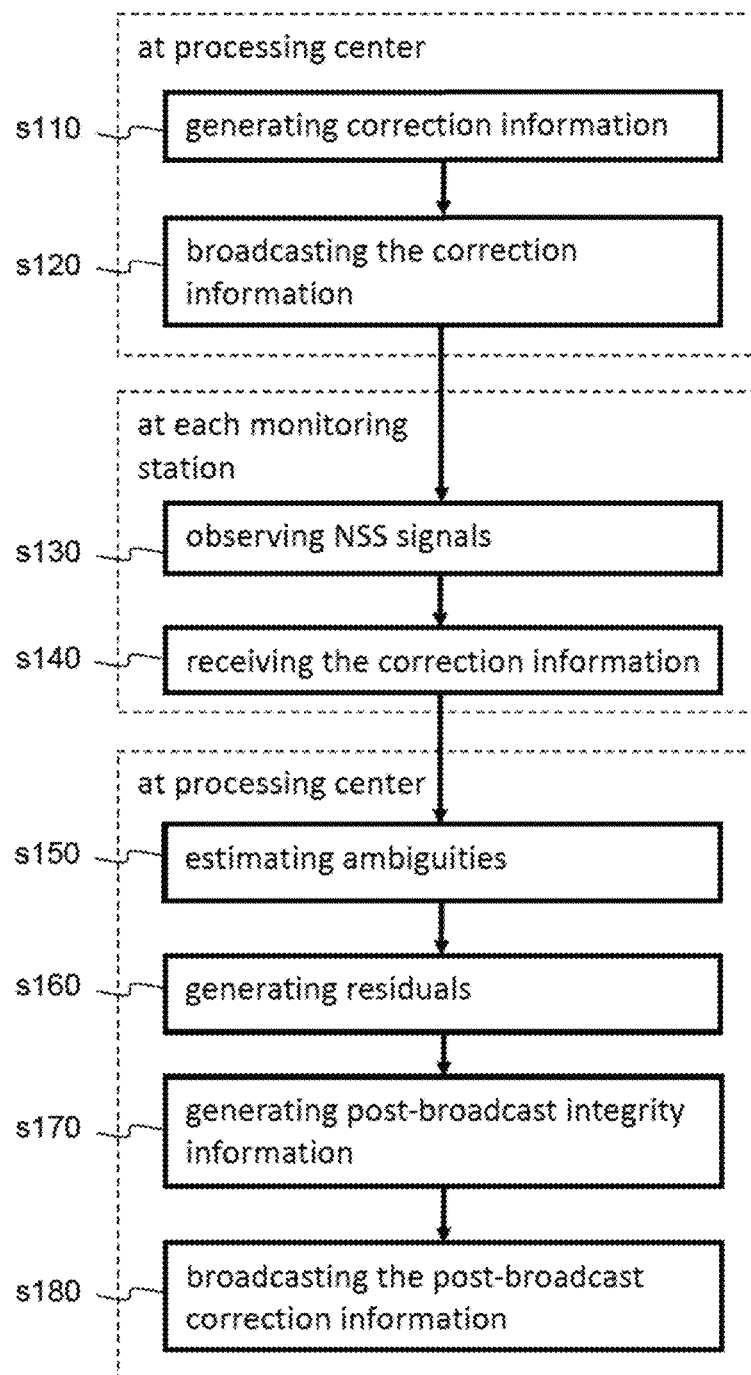
FIG. 2b is a flowchart of a method in one embodiment of the invention, wherein a processing center performs step s150 of estimating ambiguities and step s160 of generating residuals.

In another embodiment, schematically illustrated by FIG. 2b, the monitoring station(s) send(s) the received correction information back to the processing center, and steps s150 and s160 are then performed at the processing center.

In yet another embodiment (not illustrated), step s150 of estimating the ambiguities is performed at the monitoring station(s), the monitoring station(s) send(s) the estimated ambiguities to the processing center, and the residuals are then generated s160 at the processing center.

In each of these embodiments, some form of feedback is therefore transmitted from the monitoring station(s) back to the processing center.

In step s170, the processing center then generates the so-called post-broadcast integrity information by comparing the residuals (generated in step s160) with quality indicators of the correction information received at the monitoring station(s), i.e. with the (delayed) quality indicators received at the monitoring station(s) together with (or as part of) the correction information. Namely, to determine if a piece of correction information (also referred to simply here as a correction) should be treated as failed in the sense that its integrity is violated, the residuals (Res) may for example be compared to the quality indicators (QI) of the corrections and a given threshold, as follows:

$$|Res|>QI+threshold,$$

wherein the operator |...| is the absolute value. Other forms of comparisons may be used.

In step s180, at a second point in time after the first point in time, such as a few seconds (for example 2, 3, 4, 5, 7, 10, 15, or 20 seconds) thereafter, the processing center broadcasts the post-broadcast integrity information. A specific piece of post-broadcast integrity information relates to a specific piece of correction information broadcasted beforehand. The relation may for example be implicit from the time of reception of the specific piece of post-broadcast integrity information with respect to the time of reception of the corresponding specific piece of correction information broadcasted beforehand.

In one embodiment, the post-broadcast integrity information is broadcast through the same communication medium as the correction information. In one embodiment, the post-broadcast integrity information is broadcast through the same communication medium and same correction data stream (here sometimes referred to simply as "correction stream") as the correction information.

In one embodiment, the post-broadcast integrity information comprises integrity information per satellite, per satellite system (i.e., GPS, Galileo, GLONASS, etc.), and/or per geographical region. Providing integrity information per geographical region is especially applicable for ionosphere and tropospheric correction information, since such correction information often has a limited regional applicability. In one embodiment, post-broadcast integrity information comprises integrity flags transmitted inside a correction stream. The integrity flags may for example be provided per satellite and/or per geographical region. In one embodiment, post-broadcast integrity information comprises integrity alarms transmitted within a correction stream, either in addition to the integrity flags or as an alternative thereto. Integrity alarms may be derived from integrity flags and may for example be provided per satellite system and/or per geographical region.

The post-broadcast integrity information may be encoded and/or encrypted prior to broadcasting it.

Thanks to the transmission of post-broadcast integrity information, devices using the broadcasted correction information may be informed that the integrity of the correction information can be trusted and is therefore safe to use, or, on the contrary, that it cannot be trusted and may therefore be unsafe to use. The post-broadcast integrity information relating to the correction information stems from processing the correction information received at the monitoring station(s) and then using it for estimating ambiguities in the carrier phase of the NSS signals observed at the monitoring station(s). A positioning solution obtained based on the estimated ambiguities may then be checked against a reference position of each of the monitoring station(s). Therefore, problems arising in the context of broadcasting (such as problems arising from the data transmission channel that would remain undetected by conventional error detection schemes, such as CRC methods), however rare or unlikely these problems may be, can be accounted for in the post-broadcast integrity information. In turn, devices running applications configured to potentially using the correction information may more reliably decide, based on the post-broadcast integrity information, whether to use the correction information and, if so, to which extent and for which purpose. Problems during broadcasting may also arise for example from a malicious attack. For example, an attacker may attempt to intentionally manipulate the correction data stream in order to influence the position estimation process in the rover. If this is done on the broadcasted data streams, many devices could be compromised. The post-broadcast integrity information allows the detection of this situation because the modified corrections would be detected as faulty.

This increased reliability may be particularly useful for safety-critical applications such as, but not limited to, highly-automated driving and autonomous driving applications in vehicles, as these applications demand a very high reliability. Other exemplary applications may include machine guidance, construction work, and operation of unmanned aerial vehicles (UAV), also known as drones. In one embodiment, the provision of correction information and post-broadcast integrity information as described above is part of a safety service or safety-of-life service, which is a "radiocommunication service used permanently or temporarily for the safeguarding of human life and property" (reference [8], Article 1.59).

Figure 3:
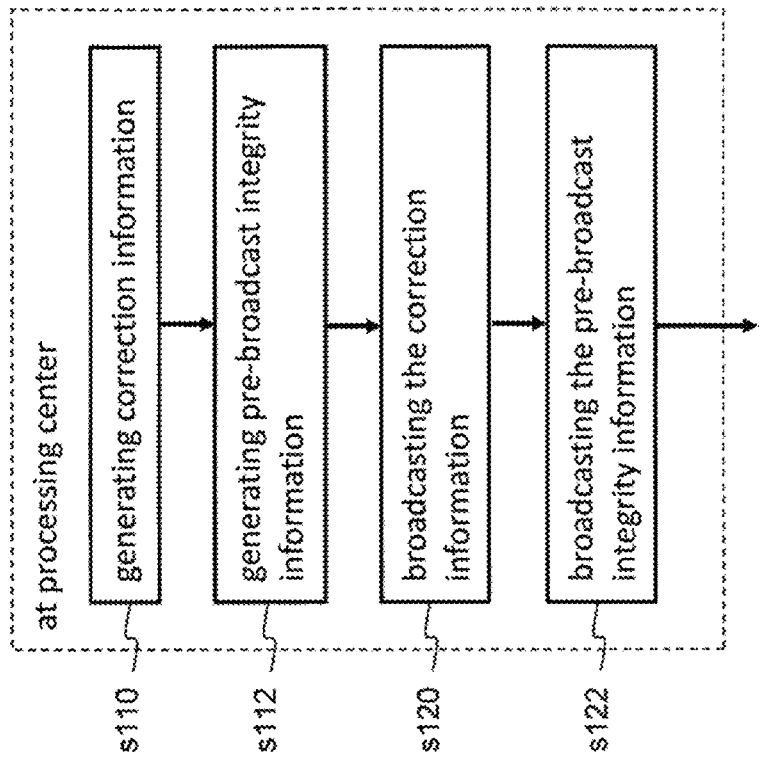
FIG. 3 is a flowchart of a portion of a method in one embodiment of the invention, wherein a processing center generates and broadcasts pre-broadcast integrity information.

FIG. 3 is a flowchart of a portion of a method in one embodiment of the invention, which differs from the embodiments discussed with reference to FIGS. 1, 2a and 2b in that the processing center further generates s112 and broadcasts s122 pre-broadcast integrity information.

Namely, in step s112, the processing center generates pre-broadcast integrity information based on NSS multiple-frequency signals observed at the network of reference stations, and on estimating ambiguities in the carrier phase of the NSS signals observed at the network of reference stations. The pre-broadcast information may be generated in a similar manner as the post-broadcast integrity information (see above-mentioned comparison |Res|>QI+threshold), except that the pre-broadcast integrity information is not based on correction information received at the monitoring station(s). Thus, there is no latency in the generation of the pre-broadcast integrity information. The pre-broadcast integrity information may be broadcast at the same time as the correction information to which it relates.

In step s122, the processing center then broadcasts the pre-broadcast integrity information at the above-mentioned first point in time. As mentioned above, the pre-broadcast integrity information may be broadcast at the same time as the correction information to which it relates. That is, steps s120 and s122 may be performed concurrently. In one embodiment, the pre-broadcast integrity information is broadcast through the same communication medium and same correction stream as the correction information. The pre-broadcast integrity information may be encoded and/or encrypted prior to broadcasting.

In one embodiment, if, upon generating the pre-broadcast integrity information, it turns out that the integrity of the correction information is violated (not illustrated in FIG. 3), the erroneous correction information may be filtered out prior to broadcasting from the processing center. In other words, the erroneous correction information, i.e. the out-of-tolerance corrections, may be prevented from being broadcast. As explained in regard to Table 1 below, optionally, the quality indicator may be set to a "DoNotUse" condition. This can be used to prevent an NSS receiver from continuing to use correction information broadcast at lower update intervals.

In one embodiment, the pre-broadcast integrity information comprises integrity information per satellite, per satellite system, and/or per geographical region.

In one embodiment, the processing center broadcasts a correction stream, i.e. stream of data, comprising correction information, pre-broadcast integrity information, and post-broadcast integrity information. The correction stream may contain, at regular or irregular intervals, a bit or set of bits, here referred to as "integrity flag", representing (as combined pre- and post-broadcast integrity information) one of at least: (i) a state indicating that integrity of the correction information is monitored both pre- and post-broadcasting, i.e. both before and after broadcasting the correction information, and no integrity violation has been detected; and (ii) another state indicating that integrity of the correction information is monitored both pre- and post-broadcasting and an integrity violation has been detected.

In one embodiment, the pre- and post-broadcast integrity information, such as for example the per-satellite, per-satellite-system, and/or per-geographical-region pre- and post-broadcast integrity information, comprises a plurality of states, such as four states, conveyed as part of a correction stream. The following states may for example be conveyed:

TABLE 1

Exemplary states that may be conveyed in a correction stream

| States | Meaning |
| --- | --- |
| "Integrity not monitored" | The integrity of the correction information is neither monitored prior to nor after broadcasting it. That is, both the pre- and post-broadcasting monitoring are turned off. |
| "Pre-broadcast monitored" | The integrity of the correction information is monitored prior to but not after broadcasting it. That is, the post-broadcasting monitoring is turned off. |
| "Pre-broadcast monitored and post-broadcast monitored" | The integrity of the correction information is monitored both prior to and after broadcasting it. That is, both the pre- and post-broadcasting monitoring are turned on. |
| "Post-broadcast monitoring violation" | The integrity of the correction information is monitored both prior to and after broadcasting it, and the post-broadcast monitoring process has detected an integrity violation. |

Purely as an example, the sets of bits {00; 01; 10; 11} may be used for conveying these four states for the whole system, or for a given satellite, a given satellite system, and/or a given geographical region.

The above-mentioned states, which may be called integrity flags, provide a compact way of conveying pre- and post-broadcast integrity information within a correction stream. In that context, the "Pre-broadcast monitored and post-broadcast monitored" state depicted in Table 1 indicates that, for the correction information currently received, the integrity is being monitored pre-broadcast (and no violation has been detected), and, for the correction information received, let's say, 10 seconds ago (or whatever the latency for generating the post-broadcast integrity information may be), the integrity is being monitored post-broadcast (and no violation has been detected). Likewise, the "Post-broadcast monitoring violation" state depicted in Table 1 indicates that, for the correction information currently received, the integrity is being monitored pre-broadcast (and no violation has been detected), but, for the correction information received, let's say, 10 seconds ago (or whatever the latency may be), an integrity violation has been detected.

In one embodiment, no "Pre-broadcast monitoring violation" state is needed, because the processing center refrains, as a consequence of pre-broadcast monitoring, from broadcasting the corrections, with the option of also broadcasting the quality indicator set to a "DoNotUse" condition. Sending a "DoNotUse" indicator for the failed correction information has the advantage of preventing an NSS receiver from continuing to use correction data which was not failing the integrity check at the time of broadcast but was detected meanwhile as failed due to a repeated integrity check with more recent NSS signals from the monitoring stations. This accounts for the fact that an NSS receiver typically has to re-use latent correction information for correcting its observed NSS signals. NSS receivers typically observe NSS signals at least every second for kinematic applications while correction information is provided at lower update intervals (e.g. 40 seconds for regional ionosphere corrections).

The invention also relates, in one embodiment, to a correction stream conveying the above-mentioned plurality of states or integrity flags.

In one embodiment (either with or without pre-broadcast integrity information), after an integrity violation has been detected post-broadcast, the processing center may continue to indicate, for a specified duration, such as for example 30, 60 or 120 seconds, that the correction information cannot be trusted. In other words, the processing center may change the integrity flag of the correction associated with an integrity violation to the "Post-broadcast monitoring violation" state for the specified duration (provided that the correction is still broadcast) and a corresponding integrity alarm flag to "Warning" or "Alert" (as will be discussed further below).

Likewise, after an unmonitored situation has been detected in post-broadcast, the processing center may continue to indicate, for a specified duration, such as for example 30, 60 or 120 seconds, that the correction information cannot be trusted. In other words, the processing center may refrain from changing the integrity flag of the correction that is not sufficiently monitored (i.e., too few stations providing residuals) by leaving the integrity flag in the "Integrity not monitored" or "Pre-broadcast monitored" state for the specified duration (provided that the correction is still broadcast) and by setting a corresponding integrity alarm flag to "Unmonitored" (as will be discussed further below).

Figure 4:
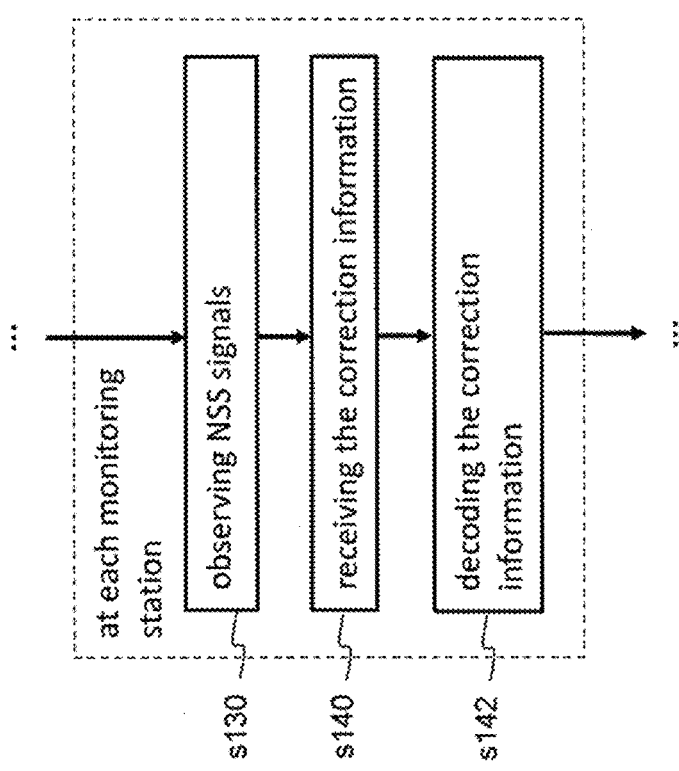
FIG. 4 is a flowchart of a portion of a method in one embodiment of the invention, wherein the correction information is decoded at the monitoring station or, if there are more than one monitoring station, at each monitoring station.

FIG. 4 is a flowchart of a portion of a method in one embodiment of the invention, showing that the correction information is decoded s142 at the monitoring station(s). Thus, potential problems arising in the context of encoding, transmitting, and decoding of the broadcasted messages carrying the correction information (for example as part of a correction stream) can be accounted for in the post-broadcast integrity information to be generated.

Figure 5:
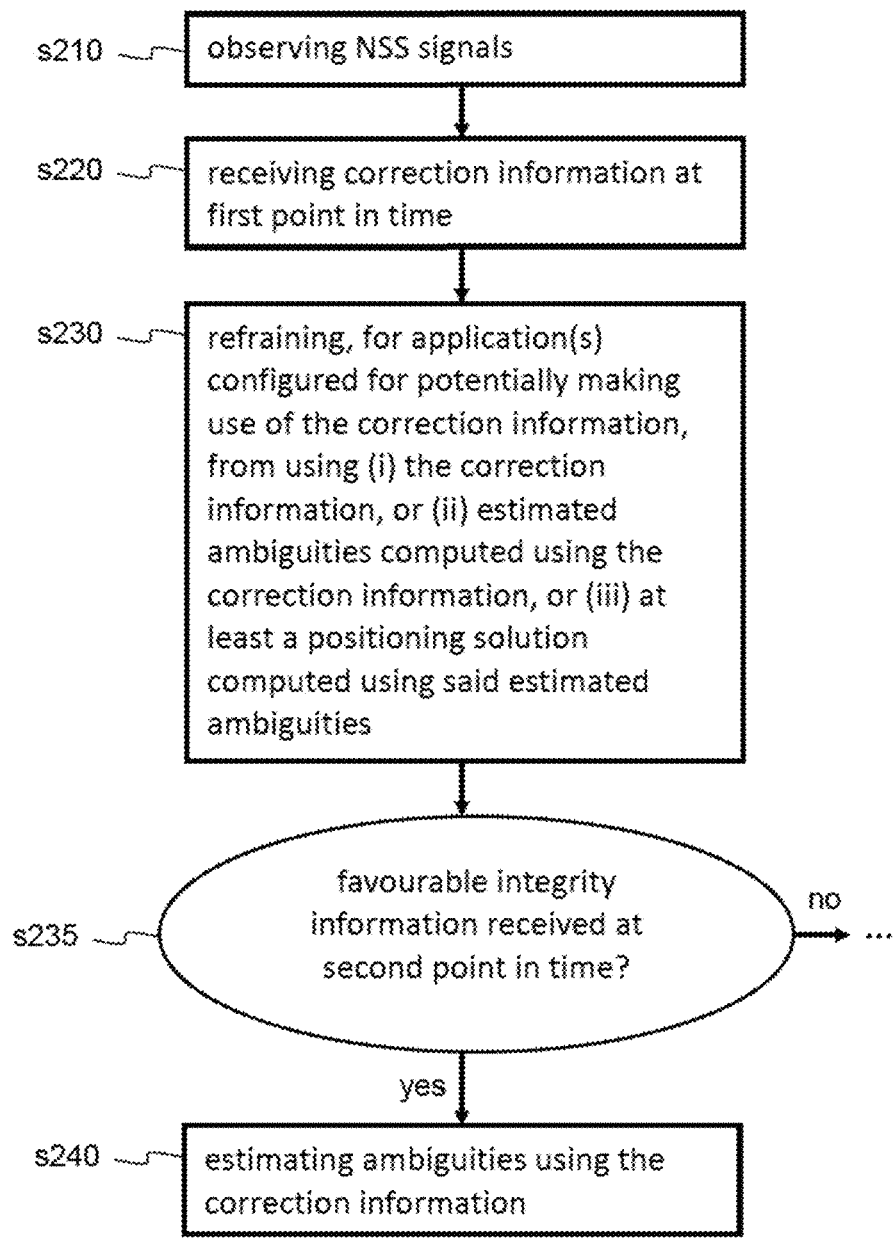
FIG. 5 is a flowchart of a method in one embodiment of the invention, including receiving correction information at a first point in time and potentially receiving post-broadcast integrity information at a second point in time.

FIG. 5 is a flowchart of a method in one embodiment of the invention, including receiving correction information at a first point in time and potentially receiving post-broadcast integrity information at a second point in time. The method is carried out by a NSS receiver or, more generally, by a NSS receiver system comprising the NSS receiver and optionally other elements. The method comprises the following steps:

In step s210, NSS signals from a plurality of NSS satellites over multiple epochs are observed, or such observed signals are obtained. In step s220, at a first point in time, correction information is received, i.e. information suitable, as described above, for correcting observations useful for estimating at least one of: (i) carrier phase ambiguities and (ii) a position of at least one NSS receiver. The received correction information comprises at least one of: (a) satellite orbit correction information, (b) satellite clock correction information, (c) ionospheric correction information, and (d) tropospheric correction information (as already described above with reference to FIG. 1).

Then, in step s230, the NSS receiver or NSS receiver system, whichever is in charge of performing the method, refrains, in relation to at least one application configured for potentially making use of the correction information (such as for example software or hardware supporting a safety-critical application, which may or may not use the correction information depending on its integrity), from using (1) the correction information, or (2) ambiguities in the carrier phase of the NSS signals observed in step s210, estimated based on the correction information (i.e., the ambiguities being estimated using the correction information), or at least (3) a positioning solution computed based on said estimated ambiguities. The NSS receiver, or NSS receiver system, refrains from doing so at least until receiving, at a second point in time after the first point in time, post-broadcast integrity information, i.e. information indicating that a sufficient trust can be placed in a correctness of the correction information received at the first point in time. In other words, the correction information or at least a by-product thereof is "quarantined" until favourable post-broadcast integrity information is received. Before receiving the post-broadcast integrity information, the correction information may be used in order to generate a by-product, but the by-product (e.g., a positioning solution) should not be used for the safety-critical application.

When the method refrains s230 from using the correction information, the correction information may be stored, i.e. buffered, from the first point in time to the second point in time. When the method refrains s230 from using estimated ambiguities in the carrier phase of the NSS signals observed at the NSS receiver (the estimated ambiguities being computed based on the correction information), the estimated ambiguities may be stored, i.e. buffered, from the first to the second point in time. Likewise, when the method refrains s230 from using a positioning solution computed based on said estimated ambiguities, the positioning solution may be stored, i.e. buffered, from the first to the second point in time.

If no post-broadcast integrity information has been received at the second point in time (in FIG. 5: s235, then "no"), i.e. after a given time-to-alert (TTA) interval, or if post-broadcast integrity information has been received but does not indicate that a sufficient trust can be placed in the correctness of the correction information received at the first point in time (in FIG. 5: s235, then "no"), the buffered correction information may for example be discarded (not illustrated). The ellipsis, i.e. " . . . ", in FIG. 5 represents the NSS receiver or NSS receiver system disregarding the buffered correction information and/or performing any other action appropriate in the context of the application(s) potentially making use of the correction information.

In contrast, if post-broadcast integrity information has been received at the second point in time, i.e. after the TTA interval, which indicates that a sufficient trust can be placed in the correctness of the correction information received at the first point in time (in FIG. 5: s235, then "yes"), i.e. if, in other words, the post-broadcast integrity information is "favourable", ambiguities in the carrier phase of the observed signals are estimated, in step s240, based on the correction information received at the first point in time, or, if this had already done, using the estimated ambiguities or the positioning solution computed based thereon. That is, the ambiguity estimation may then lead to computing a positioning solution (not illustrated in FIG. 5). In one embodiment, the ambiguity estimation comprises resolving the ambiguities.

In such a manner, the correction information may be quarantined in that the correction information, or at least a by-product thereof, is used in an application, such as for example a safety-critical application, only if post-broadcast integrity information is received indicating that a sufficient trust can be placed in the correctness of the correction information. In one embodiment, if, after a TTA interval (such as for example 2, 3, 4, 5, 7, 10, 15, or 20 seconds) following the receipt of a specific piece of correction information, no post-broadcast integrity information for the type of correction has been received, then that correction information may be regarded as expired and may be discarded.

In one embodiment, upon receiving post-broadcast integrity information relating to correction information received at a first point in time, the post-broadcast integrity information indicating that a sufficient trust can be placed in the correctness of said correction information, the correction information received at the first point in time is inputted into a filter operated by the NSS receiver or NSS receiver system. In that context, a filter is or comprises an algorithm or process, or a piece of software and/or hardware configured for implementing such an algorithm or process, in which a set of state variables (or "state vector") are maintained over time, i.e. the values of the state variables are estimated based on a series of measurements made over time. The filter may comprise, for example, a Kalman filter, a least squares estimator, and/or a robust estimator.

In one embodiment, a vehicle comprises equipment configured to carry out the method illustrated in FIG. 5. The vehicle may be any type of vehicle, such as a land vehicle, an aircraft, or a watercraft. In one embodiment, the vehicle executes, or is configured to execute, a highly-automated driving application and autonomous driving application.

The relatively long latency (for example 10, 15, or 20 seconds from the above-mentioned first point in time) that may be required for generating, broadcasting and receiving the post-broadcast integrity information is not necessarily problematic for highly-automated driving and autonomous driving applications. This is because, in such applications, a sensor fusion solution is typically implemented, which does not rely exclusively on NSS data, but relies also, for example, on inertial navigation system (INS) equipment. In addition to using other sensors, the reliable "old" position, computed using integrity-checked correction data, can be propagated to the current time using the latest carrier phase observations (e.g. observed at 10 Hz) and the estimated ambiguities with high accuracy.

Figure 6:
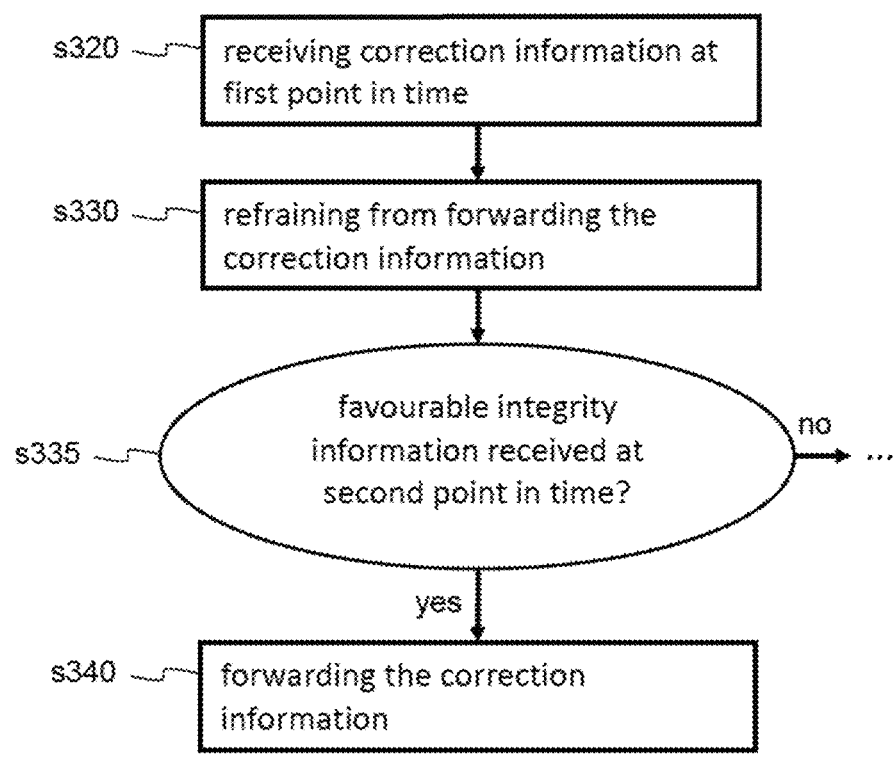
FIG. 6 is a flowchart of a method for conditionally forwarding correction information in one embodiment of the invention.

FIG. 6 is a flowchart of a method for conditionally forwarding correction information in one embodiment of the invention. The method is carried out by a device, such as for example a device having no NSS receiver. The method comprises the following steps:

In step s320, correction information is received at a first point in time, as described above with reference to step s220 of FIG. 5.

Then, in step s330, the device refrains forwarding the correction information at least until receiving, at a second point in time after the first point in time, post-broadcast integrity information, i.e. information indicating that a sufficient trust can be placed in a correctness of the correction information received at the first point in time. The correction information may be stored, i.e. buffered, during the interval of time between the first point in time and the second point in time.

If no post-broadcast integrity information has been received at the second point in time (in FIG. 6: s335, then "no"), i.e. within a given TTA interval, or if post-broadcast integrity information has been received but it does not indicate that a sufficient trust can be placed in the correctness of the correction information received at the first point in time (in FIG. 6: s335, then "no"), the buffered information may for example be discarded (not illustrated in FIG. 6). The ellipsis, i.e. " . . . ", in FIG. 6 represents the device disregarding the buffered correction information and/or performing any other appropriate action.

In contrast, if post-broadcast integrity information has been received at the second point in time (i.e., after the TTA interval), which indicates that a sufficient trust can be placed in the correctness of the correction information received at the first point in time (in FIG. 6: s335, then "yes"), the correction information received at the first point in time is forwarded s340, i.e. broadcast further.

In such a manner, the correction information received at a first point in time may be quarantined at an intermediate device. That is, said correction information is forwarded (and later used in an application, such as a safety-critical application) only if post-broadcast integrity information relating to said correction information (received at the first point in time) is received, indicating that a sufficient trust can be placed in the correctness of the correction information. In this embodiment, the element(s) or device(s) eventually using the correction information are relieved from the burden of having to buffer the correction information until receiving the post-broadcast integrity information. In other words, in this embodiment, the receiver of the re-broadcasted correction stream need not be aware of the integrity system.

In one embodiment, if, when implementing above-described step s170, the absolute value of the residual (Res) is larger than the quality indicator (QI) plus a threshold, the correction is marked as failed or faulty, i.e. the integrity of the correction information under consideration is considered to be violated. The threshold may for example be set to 0.5 meter for geometric corrections (satellite orbit and clock correction information, and tropospheric correction information) and 1.0 meter for ionospheric corrections (ionospheric correction information).

Furthermore, in one embodiment, broadcasted faulty corrections may be considered as an integrity failure if no post-broadcast integrity information indicating that the affected correction must not be used is received within the TTA interval, i.e. if no integrity alarm is issued over L-Band within for example 17 seconds (exemplary TTA for L-Band) or no post-broadcast integrity information is issued over Internet within for example 13 seconds (exemplary TTA for NTRIP). An integrity failure is defined as "an integrity event that lasts for longer than the TTA and with no alarm raised within the TTA" (see reference [15]).

In one embodiment, post-broadcast integrity information comprises integrity alarm states (or flags), wherein a specific integrity alarm state, e.g. "warning" or "alert", depends on the number of satellites (for satellite orbit and clock and ionosphere tropospheric correction information) or the number of monitoring stations (for tropospheric correction information) exhibiting faulty corrections. In other words, an integrity alarm state may be derived from collectively considering individual pieces of integrity information. In one embodiment, an integrity alarm state is provided per satellite system. In one embodiment, an integrity alarm state is provided per type of correction information. In one embodiment, an integrity alarm state is provided per satellite system and type of correction information.

The probability of an integrity failure occurrence (i.e. the integrity risk) may for example be specified, for a safety-critical application, to be less than:

1×10$^{-6}$ for regional GPS/Galileo geometric corrections. Considering typical update rates of geometric corrections, this may translate to a integrity failure occurrence not more than three times a year for satellite orbit and clock corrections and to an integrity failure occurrence not more than once a year for regional troposphere corrections.

1×10$^{-5}$ for regional GPS/Galileo ionospheric corrections. Considering typical update rates of regional ionospheric corrections, this may translate to an integrity failure occurrence not more than ten times a year for regional ionosphere corrections.

Based on this integrity monitoring concept for correction information, a post-broadcast integrity monitoring step using ambiguity-resolved carrier phase observations for the regional ionosphere and troposphere models may be described as follows, in one embodiment of the invention:

Correction information generated in step s110 reduces effects in user GNSS observations introduced for example by satellite clock errors, varying satellite positions, satellite biases as well as ionospheric and tropospheric signal delay. Remaining errors or unknowns for the users may comprise the receiver position, the receiver clock error, receiver tracking biases, carrier phase ambiguities, multipath, and receiver noise. The integrity monitoring process (including steps s150 and s160) operates, in one embodiment, based on ambiguity-fixed carrier phase measurements in order to be able to assess correction data errors in the sub-decimeter range. More precisely, residuals are generated in step s160 by forming the differences between, on the one hand, the GNSS raw carrier phase data observed at the individual monitoring stations (see equations (5) and (6) of ref. [4]) and, on the other hand, the modelled observations which comprise the geometric distance between the satellite position, transmitted in the correction data, and the known receiver position, the satellite clock or bias correction and the estimated carrier phase ambiguities. Multipath and receiver noise cannot be fully eliminated and are therefore reflected in the individual residuals. The equations for modelled (mod) carrier phase observations are given below:

$$L_{1,mod} = (\vec{s}_{mod} - \vec{r}_{known}) \cdot \vec{e}_{LoS} - ct^s_{mod} + T_{est/mod} + I_{1,mod} - b^s_{1,mod} + \lambda_1 N_{1,est}$$

$$L_{1,mod} = (\vec{s}_{mod} - \vec{r}_{known}) \cdot \vec{e}_{LoS} - ct^s_{mod} + T_{est/mod} + I_{1,mod} - b^s_{1,mod} + \lambda_1 N_{1,est}$$

$$L_{2,mod} = (\vec{s}_{mod} - \vec{r}_{known}) \cdot \vec{e}_{LoS} - ct^s_{mod} + T_{est/mod} + \frac{\lambda_2^2}{\lambda_1^2} I_{1,mod} - b^s_{2,mod} + \lambda_2 N_{2,est}$$

where:
$L_{1,mod}$ and $L_{2,mod}$ are the modelled carrier phase observations for first and second frequencies in metric unit lengths;
$\vec{s}_{mod}$ is the modelled satellite position vector;
$\vec{r}_{known}$ is the known receiver position vector;
$\vec{e}_{LoS}$ is the Line-of-Sight unit vector pointing from the receiver to the satellite
c is the speed of light in vacuum;
$t_{mod}^s$ is the modelled satellite clock;
$T_{est/mod}$ is the estimated (from engine) or modelled (from corrections) tropospheric delay;
$I_{1,mod}$ is the modelled ionospheric delay for the first frequency;
$b_{1,mod}^s$ and $b_{2,mod}^s$ are the modelled satellite phase biases;
$\lambda_1$ and $\lambda_2$ are the wavelengths of the carrier phase observations in metric unit lengths; and
$N_{1,est}$ and $N_{2,est}$ are the estimated ambiguities.

Furthermore, the position to which the residuals refer may be any of the three above-referred embodiments (E1), (E2), and (E3) described for the "reference position". The result of differencing the GNSS raw carrier phase observations (see equations (5) and (6) of ref. [4]) and the modelled phase observations is the following:

$$\Delta L_1 = \Delta s_{mod,LoS} + ct_r - c\Delta t_{mod}^s + \Delta T_{est/mod} + \Delta I_{1,mod} + b_1^r - \Delta b_{1,mod}^s + \lambda_1 \Delta N_1 + v_1$$

$\Delta L_1 =$ $\Delta s_{mod,LoS} + ct_r - c\Delta t_{mod}^s + \Delta T_{est/mod} + \Delta I_{1,mod} + b_1^r - \Delta b_{1,mod}^s + \lambda_1 \Delta N_1 + v_1$ $\Delta L_2 = \Delta s_{mod,LoS} + ct_r - c\Delta t_{mod}^s +$ $\Delta T_{est/mod} + \frac{\lambda_2^2}{\lambda_1^2}\Delta I_{1,mod} + b_2^r - \Delta b_{2,mod}^s + \lambda_2 \Delta N_2 + v_2$ where:
- $\Delta s_{mod,LoS}$ is the error in the satellite orbit projected in the Line-of-Sight direction;
- $t_r$ is the receiver clock;
- $\Delta t_{mod}^s$ is the error in the satellite clock;
- $\Delta T_{est/mod}$ is the error in the estimated (from engine) or modelled (from corrections) tropospheric delay;
- $\Delta I_{1,mod}$ is the error in the modelled ionospheric delay for the first frequency;
- $b_1^r$ and $b_2^r$ are the receiver phase biases;
- $\Delta b_{1,mod}^s$ and $\Delta b_{2,mod}^s$ are the errors in the modelled satellite phase biases;
- $\Delta N_{1,est}$ and $\Delta N_{2,est}$ are the errors in the estimated ambiguities; and
- $v_1$ and $v_2$ are the phase noise plus multipath.

Also in the rare case that the ambiguities are wrongly estimated (false ambiguity fixing) this would be reflected in the residuals for the respective satellite. For the sake of simplicity the terms $v_1$, $v_2$, $\Delta N_{1,est}$ and $\Delta N_{2,est}$ will be omitted in the following equations, but as mentioned here will be (eventually) reflected in the residuals. In that respect, the following simplified equations are applicable:

$\Delta L_1 = \Delta s_{mod,LoS} + ct_r - c\Delta t_{mod}^s + \Delta T_{est/mod} + \Delta I_{1,mod} + b_1^r - \Delta b_{1,mod}^s$ $\Delta L_1 = \Delta s_{mod,LoS} + ct_r - c\Delta t_{mod}^s + \Delta T_{est/mod} + \Delta I_{1,mod} + b_1^r - \Delta b_{1,mod}^s$ $\Delta L_2 = \Delta s_{mod,LoS} + ct_r - c\Delta t_{mod}^s + \Delta T_{est/mod} + \frac{\lambda_2^2}{\lambda_1^2}\Delta I_{1,mod} + b_2^r - \Delta b_{2,mod}^s$ The integrity monitoring process (including steps s150 and s160) works, in one embodiment, based on two groups of error sources: the ionospheric and geometric error components. Thus, it may use two different linear combinations of the observations at two different frequencies:

- The ionosphere-free linear combination (see equation (5) of ref. [5]) for calculating the geometric phase residuals representing errors in satellite clock, satellite orbit, and regional troposphere corrections.
- The geometry-free or ionospheric linear combination (see equation (7) of ref. [4]) for calculating ionospheric phase residuals representing the errors in the regional ionosphere corrections and ionosphere phase biases.

Using the $\Delta L_1$ and $\Delta L_2$ differential phase observations, the ionosphere-free (IF) and geometry-free (GF) linear combinations are the following:

$\Delta L_{IF} = \Delta s_{mod,LoS} + ct_r - c\Delta t_{mod}^s + \Delta T_{est/mod} + b_{IF}^r - \Delta b_{IF,mod}^s$ $\Delta L_{IF} = \Delta s_{mod,LoS} + ct_r - c\Delta t_{mod}^s + \Delta T_{est/mod} + b_{IF}^r - \Delta b_{IF,mod}^s$ $\Delta L_{GF} = \left(1 - \frac{\lambda_2^2}{\lambda_1^2}\right)\Delta I_{1,mod} + b_{GF}^r - \Delta b_{GF,mod}^s$ As mentioned above, the geometric corrections are separated into orbit+clock and regional tropospheric residuals.

The orbit+clock residuals are generated, as part of step s160, by forming the difference between, on the one hand, the ionosphere-free linear combination of the raw carrier phase observations on the first and second frequencies and, on the other hand, the computed geometric distance, the satellite clock correction, the ionosphere-free combination of the estimated carrier phase ambiguities and the troposphere zenith delay, estimated as part of the ambiguity determination, mapped to the line-of-sight of the observation for each satellite. The estimated troposphere zenith delay from the engine is assumed to be very accurate, therefore the term $\Delta T_{est}$ is considered to be zero for the orbit+clock residuals. In addition, the ionosphere-free combination of the satellite phase biases is always assumed to be zero by convention in the correction data specifications, leading to the following equation:

$\Delta L_{IF,Orb+Clk} = \Delta s_{mod,LoS} + ct_r - c\Delta t_{mod}^s + b_{IF}^r$ Since the resulting residuals still contain an unknown satellite system-specific receiver bias (receiver clock plus receiver phase bias, term $ct_r + b_{IF}^r$), a satellite system-specific mean value is removed in addition. Finally, the orbit+clock residuals ($Res_{Orb+Clk}$) can be written as follows and, as expected, they contain the satellite orbit error projected in the Line-of-Sight direction, and the satellite clock error:

$Res_{Orb+Clk} = \Delta L_{IF,Orb+Clk} - (ct_r + b_{IF}^r) = \Delta s_{mod,LoS} - c\Delta t_{mod}^s$ The ionospheric residuals are generated, as part of step s160, by subtracting the regional ionospheric slant delay given by the regional ionosphere model and the ionospheric satellite bias contained in the correction data stream and the difference of the estimated carrier phase ambiguities on the first and second frequencies from the geometry-free linear combination of the raw carrier phase observations on the first and second frequencies. Similarly to the generation of the geometric residual, a receiver bias is removed (term $b_{GF}^r$) by computing and subtracting a satellite system-specific mean value of the regional ionospheric residuals. The ionospheric residuals ($Res_{Iono}$) can be written as follows and, as expected, they contain the error of the regional ionospheric models and the error of satellite phase biases:

$Res_{Iono} = \Delta L_{GF} - b_{GF}^r = \left(1 - \frac{\lambda_2^2}{\lambda_1^2}\right)\Delta I_{1,mod} - \Delta b_{GF,mod}^s$ The generation, as part of step s160, of the tropospheric residuals differs from the generation of the orbit+clock residuals only in that the regional tropospheric slant delay given by the regional troposphere model in the correction data stream is subtracted instead of the estimated troposphere zenith delay mapped to the line-of-sight. The receiver bias in this case is the one used for the orbit+clock residuals. Therefore, the regional tropospheric residuals used for integrity monitoring comprise the combined errors of orbit, clock and regional troposphere corrections, i.e. the geometric corrections. The tropospheric residuals ($Res_{Tropo}$) are written as follows:

$Res_{Tropo} = \Delta L_{IF,Tropo} - (ct_r + b_{IF}^r)_{Orb+Clk} = \Delta s_{mod,LoS} - c\Delta t_{mod}^s + \Delta T_{mod}$ As mentioned above, the quality indicators of all corrections to be assessed are part of the broadcasted correction stream. In one embodiment, those may need to be combined to a single QI for the geometric and ionospheric corrections by taking into account the position of the user and the satellite as follows:

- The quality indicator of the orbit+clock correction is given as the square root of the sum of the squared quality indicators of satellite orbit and satellite clock.
- The quality indicator of the regional troposphere correction is given as the square root of the sum of the squared quality indicators of satellite orbit, satellite clock and slant tropospheric correction.
- The quality indicator of the regional ionospheric correction is given by the quality indicator of the slant regional ionospheric correction.

As also mentioned above, the residuals and quality indicators are compared to derive the integrity flags considering a given threshold. The comparison may for example be: |Res|>QI+threshold. The integrity flags may for example have the following possible states (as a variant of above Table 1):

- "Not Integrity-Checked": No integrity checks have been performed for this correction (neither pre- nor post-broadcast). The integrity of the correction data cannot be guaranteed.
- "Pre-Broadcast Integrity Check Passed": Pre-broadcast integrity checks have been performed for this correction prior to creating and broadcasting the correction data.
- "Pre- and Post-Broadcast Integrity Check Passed": In addition to the previous state, post-broadcast integrity checks have been performed. Residuals are within thresholds.
- "Post-Broadcast Integrity Check Failed": Post-broadcast integrity checks have been performed and residuals are outside of tolerated thresholds. Failed corrections should not be used.

Regional troposphere or regional ionosphere (per satellite) models may, in one embodiment, be considered failed if any single monitoring-station-to-satellite link is failed. This imposes strict requirements on the quality of the tracking data and the performance of the positioning engine, as a single "bad failed" residual is enough to treat the whole model as failed. A "bad failed" residual is defined as a residual larger than the acceptable threshold but the residual is not only reflecting the true residual error of the correction data. Instead the residual is in addition biased for example by a wrongly resolved integer ambiguity of the observation data used to calculate the residual. Such "bad failed" residuals are therefore not necessarily indicating an integrity problem of the correction information.

As a consequence for the orbit+clock corrections from one satellite, a "bad failed" residual from a single monitoring station does not necessarily lead to the satellite to be marked as failed. If the "bad failed" residual can be reliably classified as outlier, then the bad residual may, in one embodiment, be considered to come from a problematic monitoring station and the satellite may still be marked as passed. However, if two monitoring stations show bad residuals, the satellite may be marked as failed without any attempt to classify those bad residuals as outliers because such events observed on multiple stations could indicate problems in the correction data used for resolving ambiguities and therefore it is not safe to exclude the residuals for integrity monitoring.

The integrity flags for the geometric corrections (excluding troposphere) may be sent within the orbit and clock message on a per satellite basis. The integrity flags for the regional troposphere and ionosphere models may be sent as part of the corresponding atmospheric correction messages.

Integrity alarm flags may be sent as part of the regional ionosphere messages which are sent at a high update rate.

Several integrity alarm flags may exist for different correction data components, so that the users can be informed about detected integrity issues.

In one embodiment, the following exemplary integrity alarm flags may be provided for the regional troposphere and ionosphere corrections:

- "Unmonitored": This is the default status set by the processing center. The post-broadcast integrity information is not generated or residuals for fewer than five monitoring stations (for regional tropo) or satellite models (for regional iono) are available for integrity checks within the service area.
- "Normal": Residuals are within integrity thresholds for at least five monitoring stations (for regional tropo) or satellite models (for regional iono) and no out-of-tolerance corrections have been detected within the service area.
- "Warning": One out-of-tolerance correction has been detected within the service area and at least five monitoring stations (for regional tropo) or satellite models (for regional iono) are available for integrity checks within the service area.
- "Alert":
  - Condition A: More than one out-of-tolerance correction have been detected by more than one monitoring station (for regional tropo) or satellite model (for regional iono) models.
  - Condition B: One out-of-tolerance correction has been detected for one monitoring station (for regional tropo) or satellite model (for regional iono) within service area and fewer than five monitoring stations (for regional tropo) or satellite models (for regional iono) are available for integrity checks within the service area.

In one embodiment (for example in addition to the provision of the above-described integrity alarm flags for the regional troposphere and ionosphere corrections), the following exemplary integrity alarm flags may be provided for the orbit+clock corrections, per satellite system (GPS, GLONASS, Galileo, etc.), as follows:

- "Unmonitored": Post-broadcast integrity information is generated for fewer than four satellites.
- "Normal": Post-broadcast integrity information is generated for a minimum of four satellites.
- "Warning": Post-broadcast integrity information is generated for a minimum of four satellites, and one satellite has a "Post-Broadcast Integrity Check Failed" flag.
- "Alert":
  - Condition A: Two or more satellites each have "Post-Broadcast Integrity Check Failed" flags.
  - Condition B: Post-broadcast integrity information is generated for fewer than four satellites, and one satellite has "Post-Broadcast Integrity Check Failed" flag.

In one embodiment, the integrity alarms shall be received by the user within a certain time to alarm (TTA) interval. For corrections, this time interval may be defined as the time difference between the reception of the faulty correction data at a monitoring station and the provision of the integrity alarm flags via the correction data communication channel. Because no transmission time can be guaranteed via standard internet, a TTA cannot be defined as an absolute maximum. For the L-Band communication channel, a TTA of 17 seconds (3 sigma) may for example be targeted. For the internet (NTRIP) communication channel, a TTA of 13 seconds (3 sigma) may for example be targeted for the availability of the integrity alarm flags at a NTRIP caster. In order to achieve those challenging TTA requirements, integrity alarm messages may be sent at least with update rates of 5 seconds or lower.

In order to further illustrate embodiments of the invention, three real-world examples are discussed in the following.

In the first two examples, GPS orbit maneuvers were processed by an integrity monitoring system according to an embodiment of the invention by considering (for the sake of illustrating the operation of the integrity monitoring system) the health flag of the GPS satellites to "healthy" even though the operator of the GPS system had set it to "unhealthy". Since the satellite positions provided in the correction data stream could not react sufficiently quickly to the orbit change, the satellite positions in the correction stream contained an increasing error compared to the true positions. In the third example, regional ionospheric corrections during an ionospheric storm event with very fast ionospheric variations were analyzed.

Example 1

Figure 11:
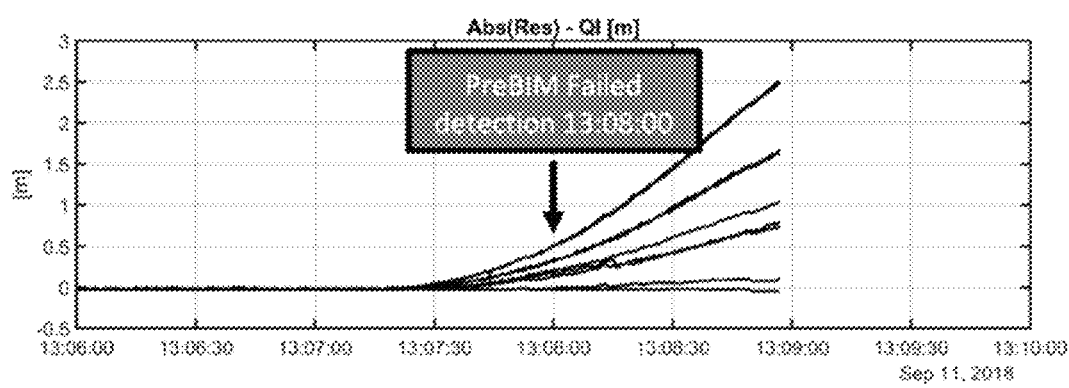
FIG. 11 shows, in a first example of operation of a system in one embodiment of the invention, differences (in meters and over time) between the absolute values of real-time pre-broadcast geometric residuals and the geometry quality indicators for GPS satellite 15 during a Delta-V maneuver for all available monitoring stations.

On Sep. 11, 2018, GPS satellite 15 performed a scheduled Delta-V maneuver, in which the velocity of the spacecraft was slightly increased by applying a small thrust. During such a maneuver, the satellite is generally set to "unhealthy" by the system operator in order to inform users not to use the satellite for positioning and therefore also no correction data would normally be generated during the unhealthy period. However, in order to analyze the reaction of the integrity monitoring system to such an orbit change, a test processing center was configured to ignore the health information that is sent by the satellites. FIG. 11 shows the differences between the absolute values of the orbit+clock residuals and the corresponding quality indicators (i.e., "Abs(res)-QI") for GPS satellite 15 as generated by a pre-broadcast integrity information generating module (hereinafter referred to simply as "pre-broadcast integrity module") in real-time for all integrity monitoring stations observing the satellite. As expected, at the start of the orbit maneuver, the geometric residuals started to increase for some of the monitoring stations while others were not showing increased residuals. This different impact can be explained in that the residuals are measured in the line of sight between monitoring station and satellite. Dependent on the projection of the orbit error to the line of sight between satellite and monitoring station, the influence might be growing fast or slowly as the orbit error increases. At 13:08:00, around 30 seconds after the start of the maneuver, the largest difference between residual and corresponding quality indicator exceeded the threshold of 0.5 meters. Consequently, no usable geometric corrections were broadcast by the processing center for this epoch and from this epoch on during the problematic period. Instead, the quality indicator of satellite clock corrections was set to "DoNotUse" and the integrity flag was sent to "Not Integrity-Checked". Thus, no faulty correction data was sent out and, in addition, the "DoNotUse" flag informed receivers of the correction stream about the problematic satellite which is not safe for positioning. The quality indicator of the satellite clock was used instead of the satellite orbit quality indicator in this scenario because, due to the correlation of satellite clock and orbit, it is sufficient to declare only one as "DoNotUse". The usage of the quality indicator of the satellite clock has the advantage that it is sent more frequently than the satellite orbit quality indicator.

Figure 12:
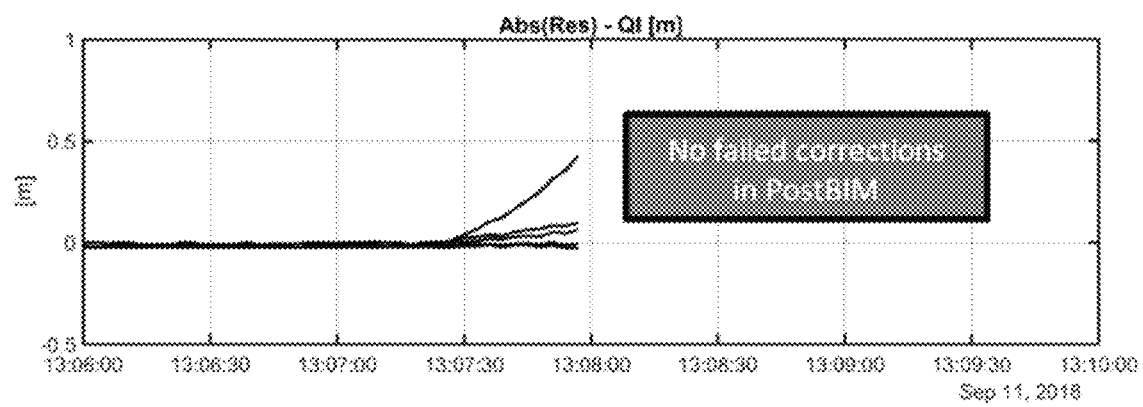
FIG. 12 shows, in the first example, differences (in meters and over time) between the absolute values of real-time post-broadcast geometric residuals and the geometry quality indicators for GPS satellite 15 during a Delta-V maneuver for all available monitoring stations.

FIG. 12 shows the differences between the absolute values of the orbit+clock residuals and the corresponding quality indicators for GPS satellite 15 generated by a post-broadcast integrity information generating module (hereinafter referred to simply as "post-broadcast integrity module") in real-time for all integrity monitoring stations observing the satellite. As explained, the residual errors observed at the monitoring stations depend on the projection of the orbit error to the line of sight of the observing monitoring station. In this experiment, partly the same stations were used for pre- and post-broadcast integrity monitoring. This allowed to study the residuals calculated in pre- and post-broadcast monitoring and it was expected that those are similar for a given monitoring station. Therefore it is not surprising that the same monitoring station located in Japan, which was providing the largest residuals in the pre-broadcast integrity module, is also responsible for the largest residuals in the post-broadcast integrity module. Since the post-broadcast integrity module uses only valid and broadcasted correction data and the geometric correction data for epoch 13:08:00 was already invalidated in the pre-broadcast integrity module by setting the satellite clock correction quality indicator to "DoNotUse", no residuals were generated by the post-broadcast integrity module from this point in time. This shows that no misleading correction data has been broadcast in this case.

Example 2

On Sep. 14, 2018, GPS satellite 19 performed a scheduled Delta-V maneuver, similar to the previously described case for G15 on Sep. 11, 2018. In order to analyze also the reaction of the post-broadcast integrity module to such an event, the integrity threshold for the geometric corrections in the pre-broadcast integrity module was increased from 0.5 to 1 m. As a consequence, and as expected, the pre-broadcast integrity module reacted later than the post-broadcast integrity module so that misleading information was broadcast by the processing center leading to integrity failed residuals on the monitoring stations in this test setup.

Figure 13:
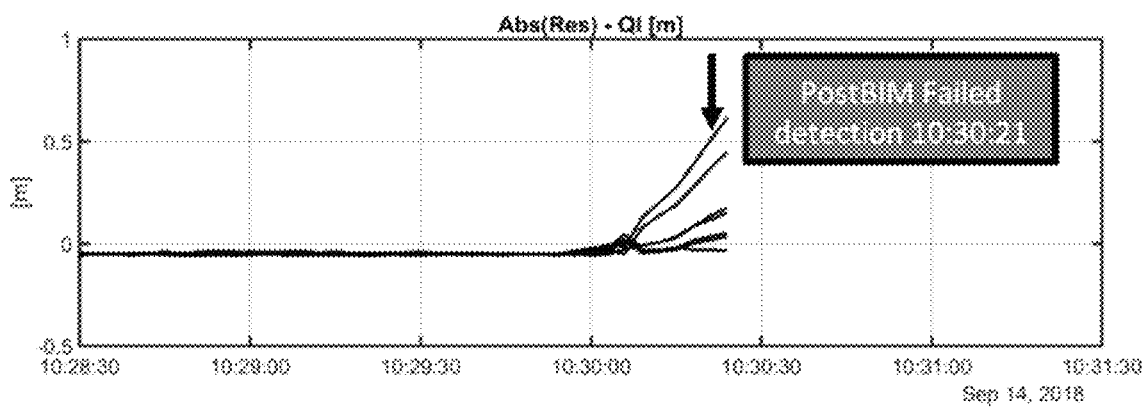
FIG. 13 shows, in a second example of operation of a system in one embodiment of the invention, differences (in meters and over time) between the absolute values of the real-time post-broadcast geometric residuals and the geometry quality indicators for GPS satellite 19 during a Delta-V maneuver for all available monitoring stations.
Figure 14:
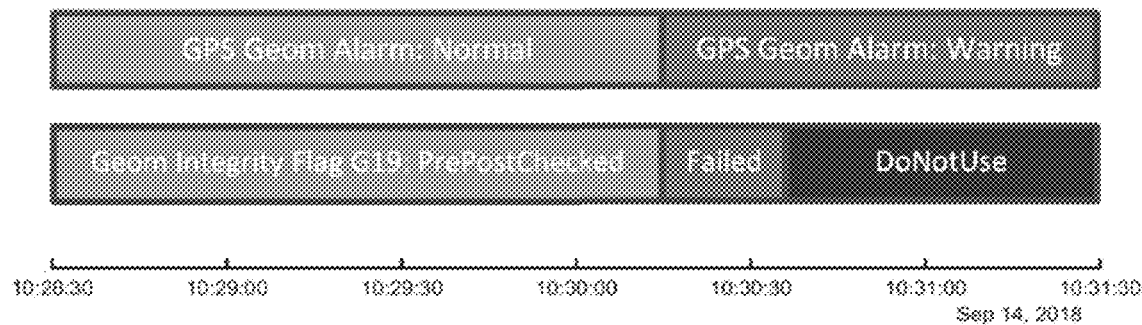
FIG. 14 shows, in the second example, the timeline of integrity information contained in the correction data stream for a Delta-V maneuver of GPS satellite 19.
Figure 15:
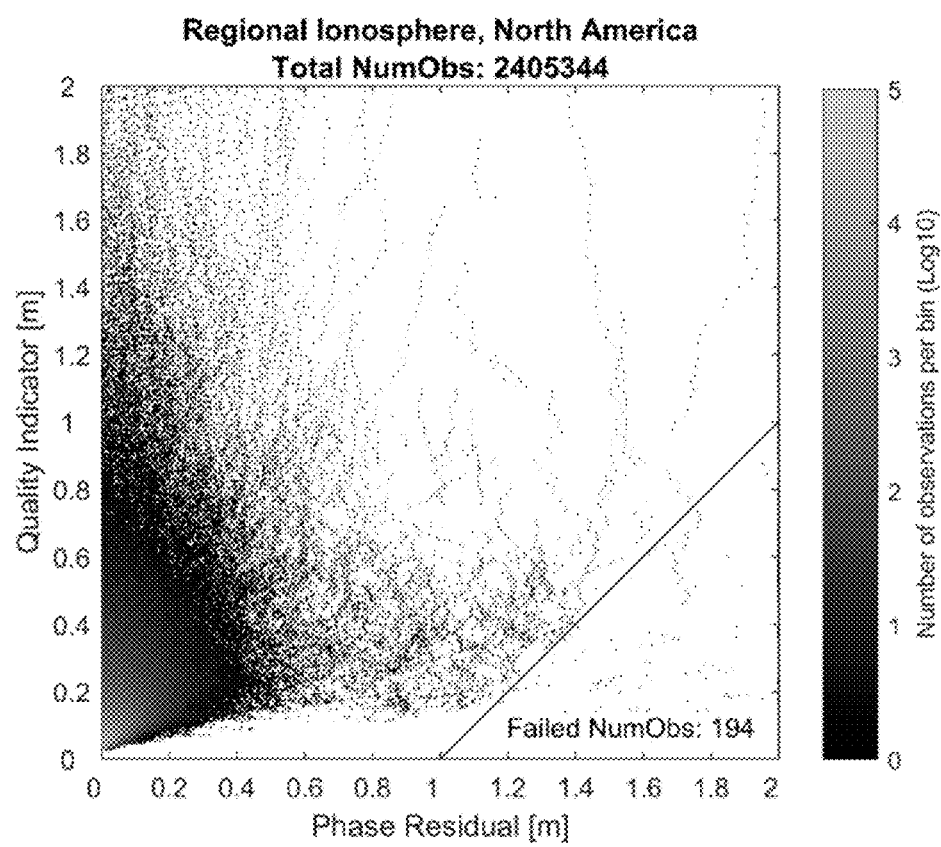
FIG. 15 is, in relation to a third example of operation of a system in one embodiment of the invention, a bivariate histogram (Stanford diagram) of regional ionospheric correction residuals and quality indicators without considering any integrity information.
Figure 16:
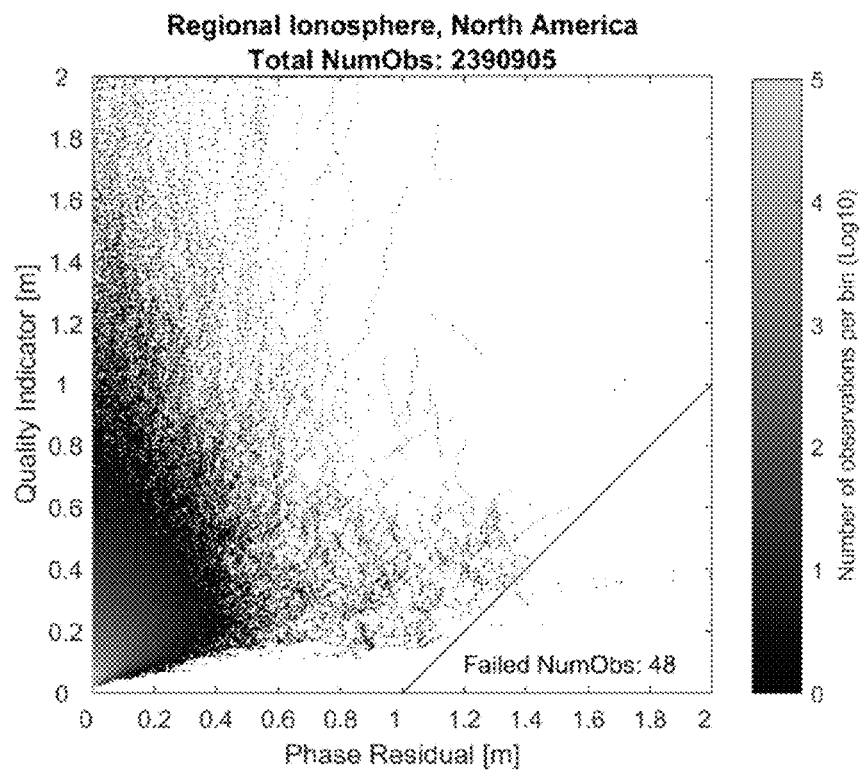
FIG. 16 is, in relation to the third example, a bivariate histogram (Stanford diagram) of regional ionospheric correction residuals and quality indicators when excluding corrections flagged as "DoNotUse" by a pre-broadcast integrity module.
Figure 17:
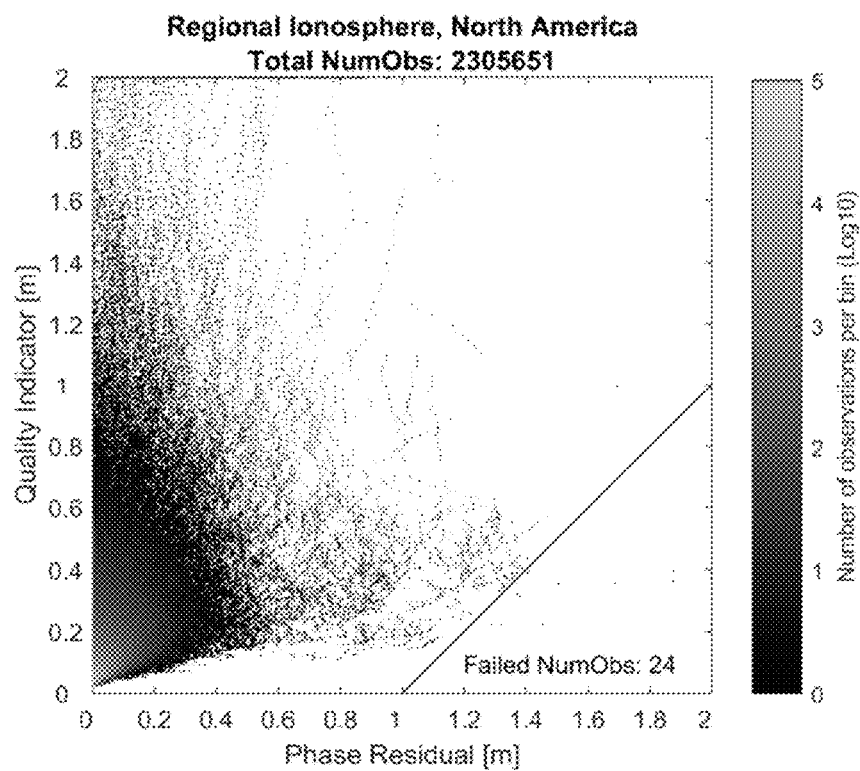
FIG. 17 is, in relation to the third example, a bivariate histogram (Stanford diagram) of regional ionospheric correction residuals and quality indicators when excluding corrections flagged as "DoNotUse" or "Post-Broadcast Integrity Check Failed"

FIG. 13 shows the differences between the absolute values of the orbit+clock residuals and the corresponding quality indicators for GPS satellite 19 generated by the post-broadcast integrity module in real-time for all integrity monitoring stations observing the satellite. Since in this case a failed residual reached the post-broadcast integrity module for the correction epoch 10:30:21, the integrity flag for the geometric correction of satellite G19 in the correction data stream was switched from "Pre- and Post-Broadcast Integrity Check Passed" (corresponding in FIG. 14 to: "Geom Integrity Flag G19 PrePostChecked") to "Post-Broadcast Integrity Check Failed" (corresponding in FIG. 14 to: "Failed") and the integrity alarm flag associated with the geometric correction information was switched from "Normal" (corresponding in FIG. 14 to: "GPS Geom. Alarm: Normal") to "Warning" (corresponding in FIG. 14 to: "GPS Geom. Alarm: Warning") after this point in time. The first post-broadcast integrity information was the "Post-Broadcast Integrity Checked Failed" flag for the GPS orbit and clock correction message referring to the epoch 10:30:27. The integrity alarm was sent immediately after this message. Eventually, the geometric corrections for epoch 10:30:36 and later were sent with a "DoNotUse" quality indicator. FIG. 14 schematically illustrates the sequence of integrity flags (top part of FIG. 14) and integrity alarm flags (bottom part of FIG. 14) for this test case.

Example 3

Figure 18:
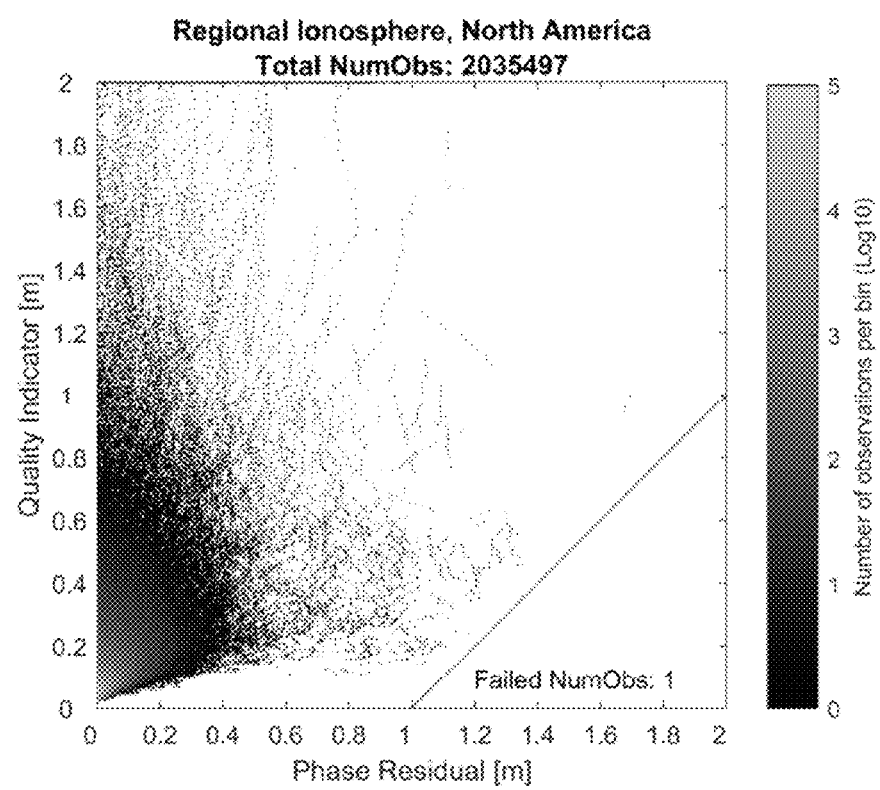
FIG. 18 is, in relation to the third example, a bivariate histogram (Stanford diagram) of regional ionospheric correction residuals and quality indicators when excluding corrections flagged as "DoNotUse" or "Post-Broadcast Integrity Check Failed" or the regional integrity alarm flag indicates "Warning" or "Alert".

On Aug. 26, 2018, the GNSS observations in the northern parts of North America were affected by a strong ionospheric storm. During periods of ionospheric storms, the impact of the ionosphere on GNSS observation data changes faster and is less spatial homogenous than under calm ionospheric conditions. Therefore, ionospheric correction data shows increased quality indicators and residual errors and the risk of integrity violations is also increased. This ionospheric storm was observed in real-time by a test processing center used in this experiment. Multiple integrity violations for the regional ionosphere models were detected during this event by the pre- and post-broadcast integrity monitoring modules. FIGS. 15 to 18 show bivariate histograms, also known as Stanford diagrams, of regional ionospheric correction residuals and corresponding quality indicators produced by static rover positioning engines fed with the data of each monitoring station. In this experiment, the impact of the pre-broadcast removal of ionospheric correction data as well as the integrity improvements were analysed by making use of integrity flags and integrity alarm flags produced by the post-broadcast integrity monitoring. As more information provided by the integrity modules is considered, more potentially bad correction data are excluded and the number of residuals detected as misleading regional ionosphere correction information at a monitoring station is reduced. In particular, the number of failed residuals was reduced from 194 when no integrity information was available (FIG. 15), to 48 when excluding corrections with "DoNotUse" quality indicators (FIG. 16), then to 24 when excluding corrections with "DoNotUse" quality indicators or "Post-Broadcast Integrity Check Failed" (FIG. 17), and finally to 1 when "DoNotUse" quality indicators, integrity flags and integrity alarm were all taken into account (FIG. 18). Shortly after this single remaining integrity violation was detected (according to FIG. 18), a corresponding integrity alarm was sent as part of the data stream within the targeted time-to-alarm and therefore is not classified as an integrity failure. In summary, no integrity failure was identified in relation to any monitoring station in this experiment when all integrity information was used.

Figure 7:
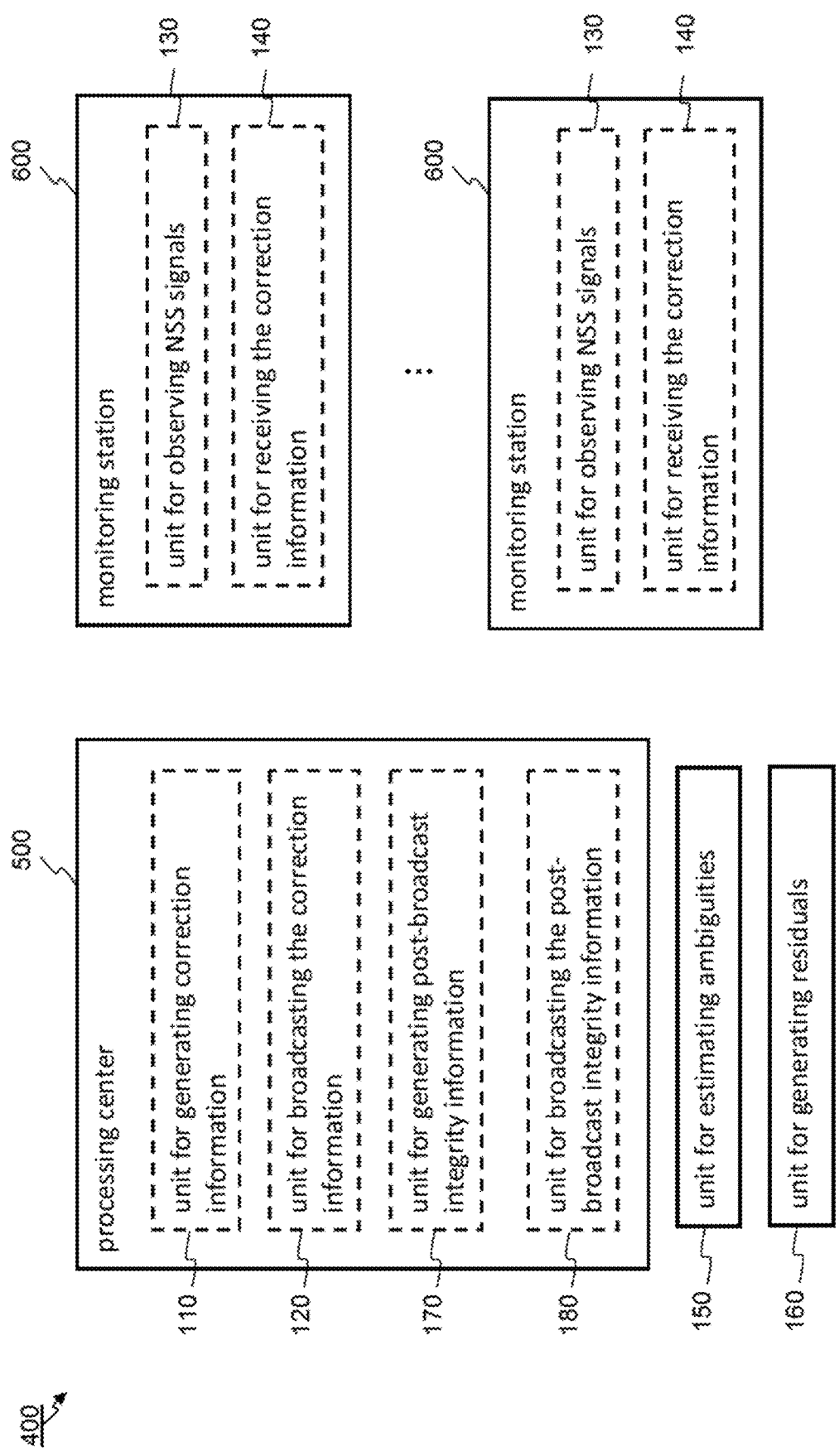
FIG. 7 schematically illustrates a system for generating correction information and post-broadcast integrity information in one embodiment of the invention.
Figure 8A:
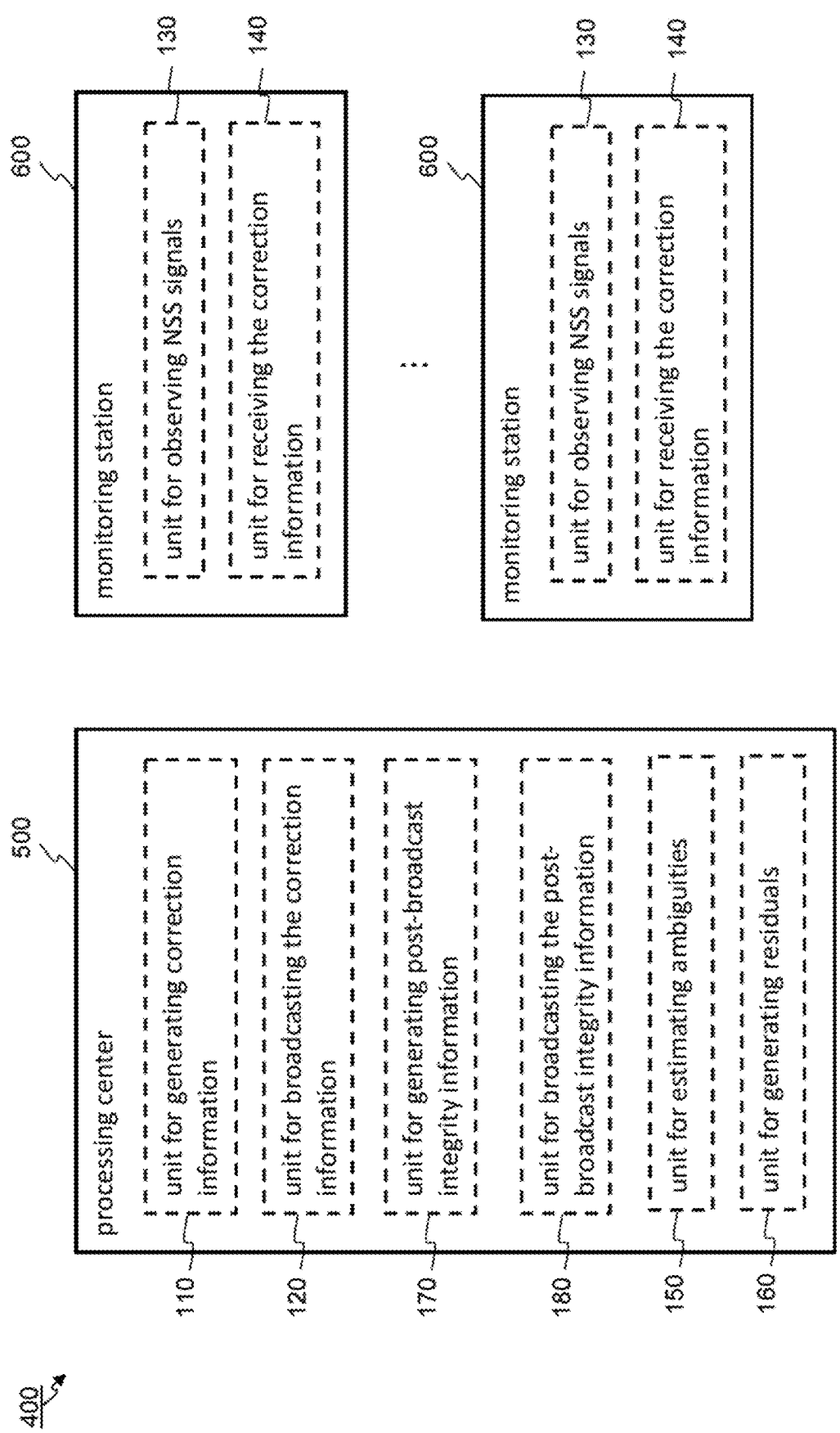
FIG. 8a schematically illustrates a system in one embodiment of the invention, wherein a processing center is in charge of estimating the ambiguities and generating residuals based on the correction information received at the monitoring station(s)
Figure 8B:
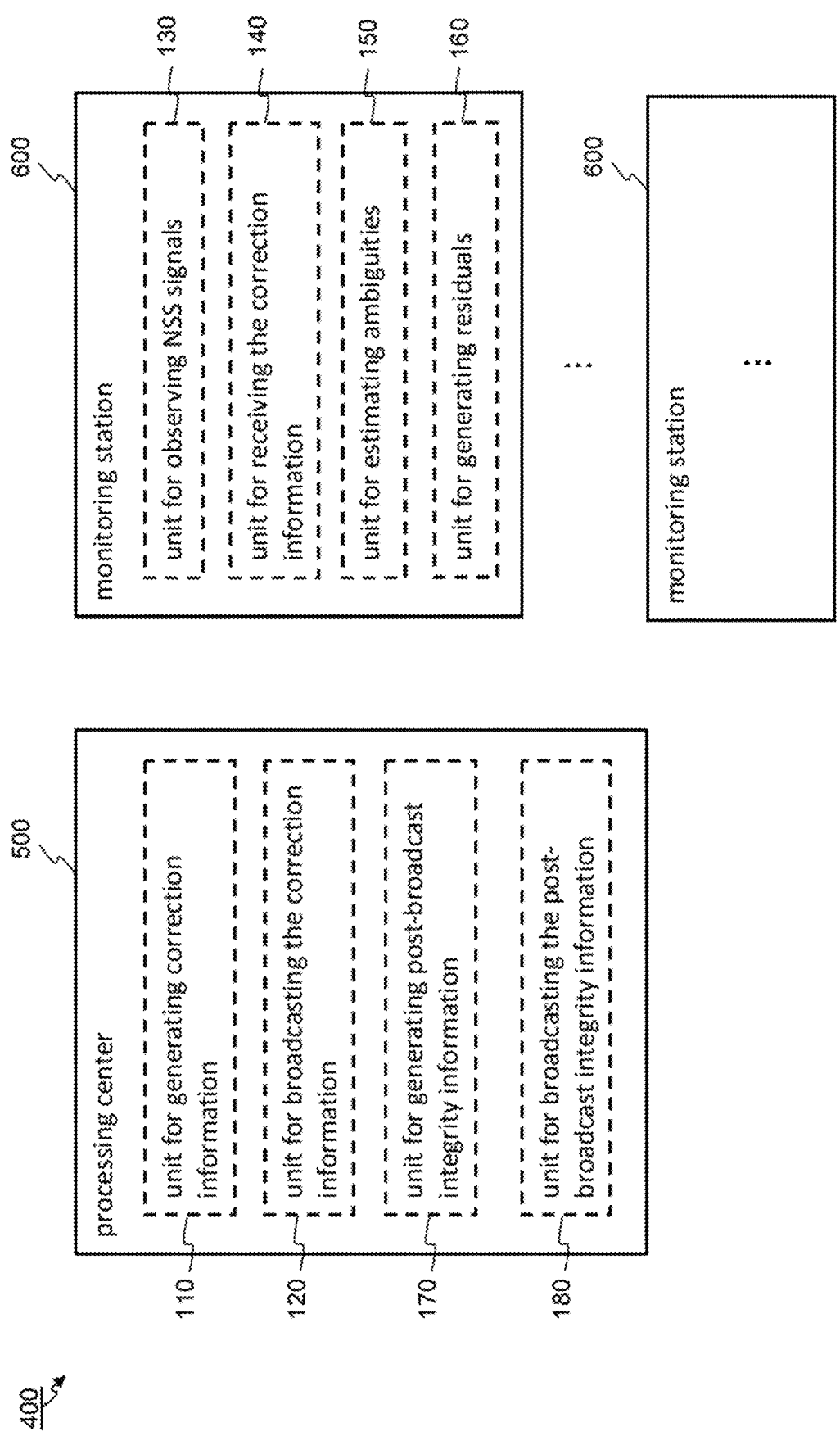
FIG. 8b schematically illustrates a system in one embodiment of the invention, wherein a monitoring station, or, if there are more than one monitoring station, each monitoring station, is in charge of estimating ambiguities and generating residuals based on the correction information received at the monitoring station(s)

FIG. 7 schematically illustrates a system 400 for generating correction information and post-broadcast integrity information in one embodiment of the invention. System 400 comprises a processing center 500, a plurality of monitoring stations 600 (as illustrated in FIG. 7) or a single monitoring station 600 (not illustrated), two units 150, 160 respectively configured for estimating ambiguities, as described in relation to step s150 of FIG. 1, and configured for generating residuals, as described in relation to step s160 of FIG. 1. In one embodiment, units 150, 160 are part of processing center 500, as illustrated in FIG. 8a. In another embodiment, units 150, 160 are part of the monitoring station(s), as illustrated in FIG. 8b.

Furthermore, processing center 500 comprises a unit 110 configured for generating correction information as described in relation to step s110 of FIG. 1, a unit 120 configured for broadcasting the correction information as described in relation to step s120 of FIG. 1, a unit 170 configured for generating post-broadcast integrity information as described in relation to step s170 of FIG. 1, and a unit 180 for broadcasting the post-broadcast integrity information as described in relation to step s180 of FIG. 1. Monitoring station 6 and the comprises a unit 130 configured for observing NSS signals as described in relation to step s130 of FIG. 1, and a unit 140 configured for receiving the correction information as described in relation to step s140 of FIG. 1.

Figure 9:
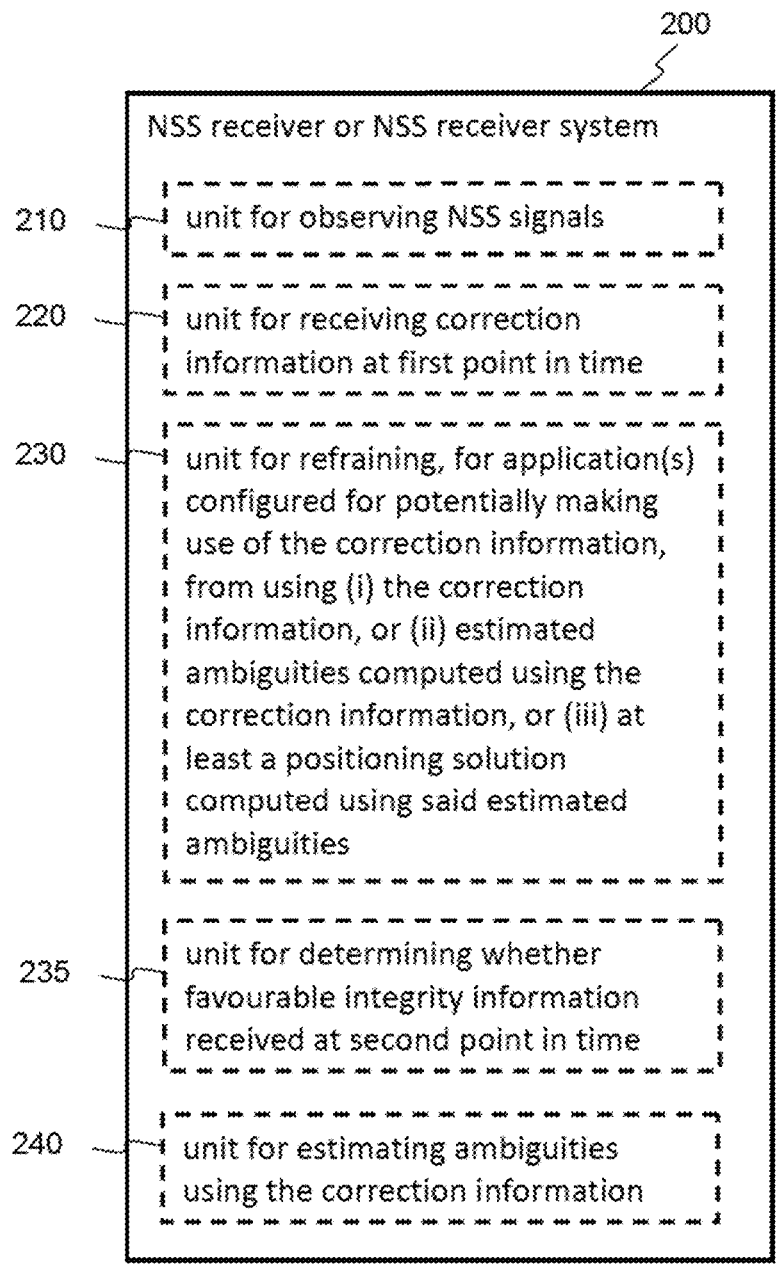
FIG. 9 schematically illustrates a NSS receiver or NSS receiver system for receiving correction information at a first point in time and potentially receiving post-broadcast integrity information at a second point in time, in one embodiment of the invention.

FIG. 9 schematically illustrates an NSS receiver or NSS receiver system for receiving correction information at a first point in time and potentially receiving post-broadcast integrity information at a second point in time, in one embodiment of the invention. NSS receiver 200 or NSS receiver system 200 comprises unit 210, 220, 230, 235, and 240, for carrying out the operations described above in relation to steps s210, s220, s230, s235, and s240 of FIG. 5, respectively.

Figure 10:
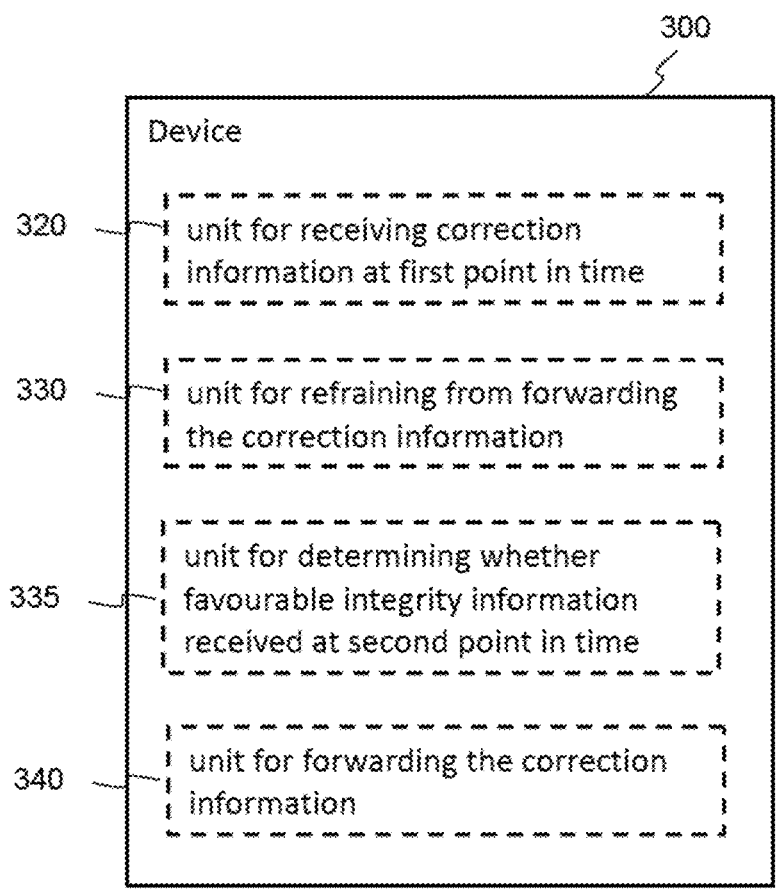
FIG. 10 schematically illustrates a device for conditionally forwarding correction information in one embodiment of the invention.

FIG. 10 schematically illustrates a device for conditionally forwarding correction information in one embodiment of the invention. Device 300 comprises unit 320, 330, 335, and 340, for carrying out the operations described above in relation to steps s320, s330, s335, and s340 of FIG. 6, respectively.

Additional Remarks

Any of the above-described methods and their embodiments may be implemented, at least partially, by means of a computer program. The computer program may be loaded on an apparatus, such as for example a NSS receiver (running on a rover station or a reference station) or a processing center (which may comprise one or a plurality of computers, as explained above). Therefore, the invention also relates to a computer program, which, when carried out on an apparatus as described above, such as for example a NSS receiver (running on a rover station or a reference station) or a processing center, carries out any one of the above-described methods and their embodiments.

The invention also relates to a computer-readable medium or a computer-program product including the above-mentioned computer program. The computer-readable medium or computer-program product may for instance be a magnetic tape, an optical memory disk, a magnetic disk, a magneto-optical disk, a CD ROM, a DVD, a CD, a flash memory unit or the like, wherein the computer program is permanently or temporarily stored. The invention also relates to a computer-readable medium (or to a computer-program product) having computer-executable instructions for carrying out any one of the methods of the invention.

The invention also relates to a firmware update adapted to be installed on receivers already in the field, i.e. a computer program which is delivered to the field as a computer program product. This applies to each of the above-described methods and apparatuses.

NSS receivers may include an antenna, configured to receive the signals at the frequencies broadcasted by the satellites, processor units, one or more accurate clocks (such as crystal oscillators), one or more central processing units (CPU), one or more memory units (RAM, ROM, flash memory, or the like), and a display for displaying position information to a user.

Where the term "unit" or "module" is used herein as units (or sub-units) modules (or sub-modules) of an apparatus (such as a NSS receiver, a device, or a processing center), no restriction is made regarding how distributed the constituent parts of a unit (or sub-unit) or module (or sub-module) may be. That is, the constituent parts of a unit (or sub-unit) or module (or sub-module) may be distributed in different software or hardware components or devices for bringing about the intended function. Furthermore, the units or modules may be gathered together for performing their functions by means of a combined, single unit (or sub-unit). The units may as well be replaced by modules for, or functional means for, performing the function they are configured to perform.

The above-mentioned units, sub-units, modules, and sub-modules may be implemented using hardware, software, a combination of hardware and software, pre-programmed ASICs (application-specific integrated circuit), etc. A unit may include a central processing unit (CPU), a storage unit, input/output (I/O) units, network connection devices, etc.

Summary of Some Inventive Concepts:
1. Method for generating information, hereinafter referred to as "correction information", suitable for correcting observations useful for estimating at least one of: carrier phase ambiguities and a position of at least one global or regional navigation satellite system receiver, hereinafter abbreviated as NSS receiver, and for generating further information, hereinafter referred to as "integrity information", suitable for indicating a trust which can be placed in a correctness of the correction information, the method comprising:
   at a computer or set of computers, hereinafter collectively referred to as "processing center":
      generating (s110) correction information based on NSS multiple-frequency signals observed at a network of reference stations, each of the reference stations having a NSS receiver, and based on estimating ambiguities in the carrier phase of the NSS signals observed at the network of reference stations, wherein the generated correction information comprises at least one of:
         satellite orbit correction information,
         satellite clock correction information,
         ionospheric correction information, and
         tropospheric correction information;
      broadcasting (s120), at a first point in time, the correction information;
   at each of at least one monitoring station, each of the at least one monitoring station having a NSS receiver:
      observing (s130) NSS multiple-frequency signals from a plurality of NSS satellites over multiple epochs; and
      receiving (s140) the correction information from the processing center;
   estimating (s150) ambiguities in the carrier phase of the NSS signals observed at the at least one monitoring station using the correction information received at each of the at least one monitoring station;
   generating (s160) residuals based on at least: the NSS signals observed at each of the at least one monitoring station, the estimated ambiguities, a known position, hereinafter referred to as "reference position", of each of the at least one monitoring station, and the correction information received at each of the at least one monitoring station; and
   at the processing center:
      generating (s170) integrity information, hereinafter referred to as "post-broadcast integrity information", wherein generating the post-broadcast integrity information comprises comparing the residuals with quality indicators of the correction information received at each of the at least one monitoring station; and
      broadcasting (s180), at a second point in time after the first point in time, the post-broadcast integrity information.

2. Method of 1, further comprising, at the processing center:
   generating (s112) integrity information, hereinafter referred to as "pre-broadcast integrity information", based on the NSS multiple-frequency signals observed at the network of reference stations, and based on estimating ambiguities in the carrier phase of the NSS signals observed at the network of reference stations; and
   broadcasting (s122), at the first point in time, the pre-broadcast integrity information.

3. Method of 2, comprising broadcasting a stream of data, hereinafter referred to as "correction stream", comprising the correction information, the pre-broadcast integrity information, and the post-broadcast integrity information, wherein the correction stream contains, at intervals, at least one integrity flag indicating one of at least:
   a state indicating that integrity of the correction information is monitored both pre- and post-broadcasting and no integrity violation has been detected; and
   another state indicating that integrity of the correction information is monitored both pre- and post-broadcasting and an integrity violation has been detected.

4. Method according to any one of 1-3, wherein the at least one monitoring station is a plurality of monitoring stations.

5. Method according to any one of 1-4, wherein one of the following applies:
   none of the at least one monitoring station is collocated with any of the reference stations;
   at least one of the at least one monitoring station is collocated with one of the reference stations but a monitoring station and a reference station do not share the same NSS antenna; and
   at least one of the at least one monitoring station is collocated with one of the reference stations and shares the same NSS antenna therewith, but a monitoring station and a reference station do not share the same NSS receiver.

6. Method according to any one of 1-5, further comprising, at each of the at least one monitoring station, and after receiving (s140) the correction information from the processing center:
   decoding (s142) the correction information.

7. Method comprising:
   observing (s210), by a global or regional navigation satellite system receiver, hereinafter abbreviated as NSS receiver, NSS signals from a plurality of NSS satellites over multiple epochs, or obtaining such observed signals;
   receiving (s220), at a first point in time, information, hereinafter referred to as "correction information", suitable for correcting observations useful for estimating at least one of: carrier phase ambiguities and a position of at least one NSS receiver, wherein the correction information comprises at least one of:
      satellite orbit correction information,
      satellite clock correction information,
      ionospheric correction information, and
      tropospheric correction information;
   refraining (s230), for at least one application configured for potentially making use of the correction information, from using
      the correction information, or
      ambiguities in the carrier phase of the observed NSS signals, estimated using the correction information, or at least a positioning solution computed using said estimated ambiguities, at least until receiving, at a second point in time after the first point in time, information, hereinafter referred to as "post-broadcast integrity information", indicating that a sufficient trust can be placed in a correctness of the correction information received at the first point in time; and, after post-broadcast integrity information has been received, which indicates that a sufficient trust can be placed in the correctness of the correction information received at the first point in time, estimating (s240) ambiguities in the carrier phase of the observed signals using the correction information received at the first point in time, or, if ambiguities had already been estimated, using the estimated ambiguities or using the positioning solution computed based thereon.

8. Method for conditionally forwarding information, hereinafter referred to as "correction information", suitable for correcting observations useful for estimating at least one of: carrier phase ambiguities and a position of at least one global or regional navigation satellite system receiver, hereinafter abbreviated as NSS receiver, the method comprising:

receiving (s320), at a first point in time, correction information comprising at least one of:
satellite orbit correction information,
satellite clock correction information,
ionospheric correction information, and
tropospheric correction information;

refraining (s330) from forwarding the correction information at least until receiving, at a second point in time after the first point in time, information, hereinafter referred to as "post-broadcast integrity information", indicating that a sufficient trust can be placed in a correctness of the correction information received at the first point in time; and, after post-broadcast integrity information has been received, which indicates that a sufficient trust can be placed in the correctness of the correction information received at the first point in time, forwarding (s340) the correction information received at the first point in time.

9. Method of 8, carried out by an apparatus or system having no NSS receiver.

10. Method, carried out by a computer or set of computers, hereinafter collectively referred to as "processing center", for generating information, hereinafter referred to as "correction information", suitable for correcting observations useful for estimating at least one of: carrier phase ambiguities and a position of at least one global or regional navigation satellite system receiver, hereinafter abbreviated as NSS receiver, and for generating further information, hereinafter referred to as "integrity information", suitable for indicating a trust which can be placed in a correctness of the correction information, the method comprising:

generating (s110) correction information based on NSS multiple-frequency signals observed at a network of reference stations, each of the reference stations having a NSS receiver, and based on estimating ambiguities in the carrier phase of the NSS signals observed at the network of reference stations, wherein the generated correction information comprises at least one of:
satellite orbit correction information,
satellite clock correction information,
ionospheric correction information, and
tropospheric correction information;

broadcasting (s120), at a first point in time, the correction information;

generating (s170) integrity information, hereinafter referred to as "post-broadcast integrity information", wherein generating the post-broadcast integrity information comprises comparing residuals generated based on at least:
NSS signals observed at each of at least one monitoring station,
ambiguities in the carrier phase of the NSS signals observed at the at least one monitoring station, estimated using the broadcasted correction information received at each of the at least one monitoring station,
a known position, hereinafter referred to as "reference position", of each of the at least one monitoring station, and
the broadcasted correction information received at each of the at least one monitoring station;
with quality indicators of the correction information received at each of the at least one monitoring station; and broadcasting (s180), at a second point in time after the first point in time, the post-broadcast integrity information.

11. System (400) configured for generating information, hereinafter referred to as "correction information", suitable for correcting observations useful for estimating at least one of: carrier phase ambiguities and a position of at least one global or regional navigation satellite system receiver, hereinafter abbreviated as NSS receiver, and for generating further information, hereinafter referred to as "integrity information", suitable for indicating a trust which can be placed in a correctness of the correction information, the system comprising:

a computer or set of computers, hereinafter collectively referred to as "processing center" (500), the processing center being configured for:
generating (s110) correction information based on NSS multiple-frequency signals observed at a network of reference stations, each of the reference stations having a NSS receiver, and based on estimating ambiguities in the carrier phase of the NSS signals observed at the network of reference stations, wherein the generated correction information comprises at least one of:
satellite orbit correction information,
satellite clock correction information,
ionospheric correction information, and
tropospheric correction information; and
broadcasting (s120), at a first point in time, the correction information;

at least one monitoring station (600), each of the at least one monitoring station (600) having a NSS receiver and being configured for:
observing (s130) NSS multiple-frequency signals from a plurality of NSS satellites over multiple epochs; and
receiving (s140) the correction information from the processing center (500);

the system (400) being configured for:
estimating (s150) ambiguities in the carrier phase of the NSS signals observed at the at least one monitoring station (600) using the correction information received at each of the at least one monitoring station (600); and generating (s160) residuals based on at least: the NSS signals observed at each of the at least one monitoring station (600), the estimated ambiguities, a known position, hereinafter referred to as "reference position", of each of the at least one monitoring station (600), and the correction information received at each of the at least one monitoring station (600); and the processing center (500) being further configured for:

generating (s170) integrity information, hereinafter referred to as "post-broadcast integrity information", wherein generating the post-broadcast integrity information comprises comparing the residuals with quality indicators of the correction information received at each of the at least one monitoring station (600); and broadcasting (s180), at a second point in time after the first point in time, the post-broadcast integrity information.

12. Global or regional navigation satellite system receiver (200), hereinafter abbreviated as NSS receiver, or NSS receiver system (200), the NSS receiver (200) or NSS receiver system (200) being configured for:

observing (s210) NSS signals from a plurality of NSS satellites over multiple epochs, or obtaining such observed signals;

receiving (s220), at a first point in time, information, hereinafter referred to as "correction information", suitable for correcting observations useful for estimating at least one of: carrier phase ambiguities and a position of at least one NSS receiver, wherein the correction information comprises at least one of:

satellite orbit correction information,
satellite clock correction information,
ionospheric correction information, and
tropospheric correction information;

refraining (s230), for at least one application configured for potentially making use of the correction information, from using the correction information, or ambiguities in the carrier phase of the observed NSS signals, estimated using the correction information, or at least a positioning solution computed using said estimated ambiguities, at least until receiving, at a second point in time after the first point in time, information, hereinafter referred to as "post-broadcast integrity information", indicating that a sufficient trust can be placed in a correctness of the correction information received at the first point in time; and, after post-broadcast integrity information has been received, which indicates that a sufficient trust can be placed in the correctness of the correction information received at the first point in time, estimating (s240) ambiguities in the carrier phase of the observed signals using the correction information received at the first point in time, or, if ambiguities had already been estimated, using the estimated ambiguities or using the positioning solution computed based thereon.

13. Vehicle comprising a NSS receiver (200) or NSS receiver system (200) of 12.

14. Device (300) for conditionally forwarding information, hereinafter referred to as "correction information", suitable for correcting observations useful for estimating at least one of: carrier phase ambiguities and a position of at least one global or regional navigation satellite system receiver, hereinafter abbreviated as NSS receiver, the device (300) being configured for:

receiving (s320), at a first point in time, correction information comprising at least one of:

satellite orbit correction information,
satellite clock correction information,
ionospheric correction information, and
tropospheric correction information;

refraining (s330) from forwarding the correction information at least until receiving, at a second point in time after the first point in time, information, hereinafter referred to as "post-broadcast integrity information", indicating that a sufficient trust can be placed in a correctness of the correction information received at the first point in time; and, after post-broadcast integrity information has been received, which indicates that a sufficient trust can be placed in the correctness of the correction information received at the first point in time, forwarding (s340) the correction information received at the first point in time.

15. Computer or set of computers, hereinafter collectively referred to as "processing center" (500), for generating information, hereinafter referred to as "correction information", suitable for correcting observations useful for estimating at least one of: carrier phase ambiguities and a position of at least one global or regional navigation satellite system receiver, hereinafter abbreviated as NSS receiver, and for generating further information, hereinafter referred to as "integrity information", suitable for indicating a trust which can be placed in a correctness of the correction information, the processing center (500) further configured for:

generating (s110) correction information based on NSS multiple-frequency signals observed at a network of reference stations, each of the reference stations having a NSS receiver, and based on estimating ambiguities in the carrier phase of the NSS signals observed at the network of reference stations, wherein the generated correction information comprises at least one of:

satellite orbit correction information,
satellite clock correction information,
ionospheric correction information, and
tropospheric correction information;

broadcasting (s120), at a first point in time, the correction information;

generating (s170) integrity information, hereinafter referred to as "post-broadcast integrity information", wherein generating the post-broadcast integrity information comprises comparing residuals generated based on at least:

NSS signals observed at each of at least one monitoring station (600), ambiguities in the carrier phase of the NSS signals observed at the at least one monitoring station (600), estimated using the broadcasted correction information received at each of the at least one monitoring station (600), a known position, hereinafter referred to as "reference position", of each of the at least one monitoring station (600), and the broadcasted correction information received at each of the at least one monitoring station (600);

with quality indicators of the correction information received at each of the at least one monitoring station (600); and broadcasting (s180), at a second point in time after the first point in time, the post-broadcast integrity information.

16. Computer program or set of computer programs comprising computer-readable instructions configured, when executed on a computer or set of computers, to cause the computer or set of computers to carry out the method according to any one of 7-10.

17. Computer program product or storage mediums comprising a computer program or set of computer programs according to 16.

Although the present invention has been described on the basis of detailed examples, the detailed examples only serve to provide the skilled person with a better understanding, and are not intended to limit the scope of the invention. The scope of the invention is much rather defined by the appended claims.

ABBREVIATIONS

Abs absolute value
C/A coarse/acquisition (code)
CLAS Centimeter Level Augmentation Service
CRC cyclic redundancy check
EGNOS European Geostationary Navigation Overlay Service
GNSS global navigation satellite system
GPS Global Positioning System
INS inertial navigation system
IP Internet Protocol
MW Melbourne-Wübbena (combination)
NL narrowlane
NSS navigation satellite system
NTRIP Networked Transport of RTCM via Internet Protocol
PPP precise point positioning
PreBIM pre-broadcast integrity monitoring
PostBIM post-broadcast integrity monitoring
PRN pseudo-random number
QI quality indicator
RAM random-access memory
Res residuals
RNSS regional navigation satellite system
ROM read-only memory
TTA time to alert or time to alarm
WL widelane

REFERENCES

[1] Hofmann-Wellenhof B., et al., *GNSS, Global Navigation Satellite Systems, GPS, GLONASS, Galileo, & more*, Springer-Verlag Wien, 2008.
[2] WO 2011/034614 A2
[3] US 2013/0044026 A1
[4] EP 3 035 080 A1
[5] EP 3 130 943 A1
[6] Fujita, S, Sato, Y, Miya M., Ota, K, Hirokawa, R, Takiguchi, J (2016) "Design of Integrity Function on Centimeter Level Augmentation Service (CLAS) in Japanese Quasi-Zenith Satellite System," *Proceedings of the 29th International Technical Meeting of The Satellite Division of the Institute of Navigation (ION GNSS+ 2016)*, Portland, Oreg., September 2016, pp. 3258-3263.
[7] Westbrook, J., Ventura-Traveset, J., Rérolle, A., Blomenhofer, H., McAnany, I., Cosmen, J., & Werner, W. (2000), "EGNOS Central Processing Facility architecture and design", *GNSS 2000 Conference*, May 2000, pp. 1-18.
[8] International Telecommunication Union (ITU), *Radio Regulations—Articles*, Geneva, 2016, ISBN 978-92-61-19121-4
[9] "Trimble Alloy GNSS Reference Receiver", retrieved on Aug. 7, 2018 from https://www.trimble.com/Infrastructure/Trimble-Alloy.aspx
[10] "Trimble Zephyr 3 Geodetic Antenna", retrieved on Aug. 7, 2018 from https://www.trimble.com/Infrastructure/Trimble-Zephyr-Geodetic-Antenna.aspx
[11] US 2012/0163419 A1
[12] US 2012/0154210 A1
[13] US 2012/0162007 A1
[14] US 2012/0154214 A1
[15] Integrity. (2018, July 26). *Navipedia*. Retrieved 07:27, Sep. 20, 2018 from https://gssc.esa.int/navipedia/index.php?title=Integrity&oldid=14073.

The invention claimed is:

1. Method for generating information, hereinafter referred to as "correction information", suitable for correcting observations useful for estimating at least one of: carrier phase ambiguities and a position of at least one global or regional navigation satellite system receiver, hereinafter abbreviated as NSS receiver, and for generating further information, hereinafter referred to as "integrity information", suitable for indicating a trust which can be placed in a correctness of the correction information, the method comprising:
at a computer or set of computers, hereinafter collectively referred to as "processing center":
generating the correction information based on NSS multiple-frequency signals observed at a network of reference stations, each of the reference stations having a NSS receiver, and based on estimating ambiguities in the carrier phase of the NSS multiple-frequency signals observed at the network of reference stations, wherein the generated correction information comprises at least one of:
satellite orbit correction information,
satellite clock correction information,
ionospheric correction information, and
tropospheric correction information;
broadcasting, at a first point in time, the correction information;
at each of at least one monitoring station, each of the at least one monitoring station having a NSS receiver:
observing the NSS multiple-frequency signals from a plurality of NSS satellites over multiple epochs; and
receiving the correction information from the processing center;
estimating the ambiguities in the carrier phase of the NSS multiple-frequency signals observed at the at least one monitoring station using the correction information received at each of the at least one monitoring station;
generating residuals based on at least: the NSS multiple-frequency signals observed at each of the at least one monitoring station, the estimated ambiguities, a known position, hereinafter referred to as "reference position", of each of the at least one monitoring station, and the correction information received at each of the at least one monitoring station; and
at the processing center:
generating integrity information, hereinafter referred to as "post-broadcast integrity information", wherein generating the post-broadcast integrity information comprises comparing the residuals with quality indicators of the correction information received at each of the at least one monitoring station; and broadcasting, at a second point in time after the first point in time, the post-broadcast integrity information.

2. Method of claim 1, further comprising, at the processing center:
generating integrity information, hereinafter referred to as "pre-broadcast integrity information", based on the NSS multiple-frequency signals observed at the network of reference stations, and based on estimating ambiguities in the carrier phase of the NSS signals observed at the network of reference stations; and
broadcasting, at the first point in time, the pre-broadcast integrity information.

3. Method of claim 2, comprising broadcasting a stream of data, hereinafter referred to as "correction stream", comprising the correction information, the pre-broadcast integrity information, and the post-broadcast integrity information, wherein the correction stream contains, at intervals, at least one integrity flag indicating one of at least:
a state indicating that integrity of the correction information is monitored both pre- and post-broadcasting and no integrity violation has been detected; and
another state indicating that integrity of the correction information is monitored both pre- and post-broadcasting and an integrity violation has been detected.

4. Method according to claim 1, wherein the at least one monitoring station is a plurality of monitoring stations.

5. Method according to claim 1, wherein one of the following applies:
none of the at least one monitoring station is collocated with any of the reference stations;
at least one of the at least one monitoring station is collocated with one of the reference stations but a monitoring station and a reference station do not share the same NSS antenna; and
at least one of the at least one monitoring station is collocated with one of the reference stations and shares the same NSS antenna therewith, but a monitoring station and a reference station do not share the same NSS receiver.

6. Method according to claim 1, further comprising, at each of the at least one monitoring station, and after receiving the correction information from the processing center:
decoding the correction information.

7. Method comprising:
observing, by a global or regional navigation satellite system receiver, hereinafter abbreviated as NSS receiver, NSS signals from a plurality of NSS satellites over multiple epochs, or obtaining such observed signals;
receiving, at a first point in time, information, hereinafter referred to as "correction information", suitable for correcting observations useful for estimating at least one of: carrier phase ambiguities and a position of at least one NSS receiver, wherein the correction information comprises at least one of:
satellite orbit correction information,
satellite clock correction information,
ionospheric correction information, and
tropospheric correction information;
refraining, for at least one application configured for potentially making use of the correction information, from using
the correction information, or
ambiguities in the carrier phase of the observed NSS signals,
estimated using the correction information, or at least a positioning solution computed using said estimated ambiguities,
at least until receiving, at a second point in time after the first point in time, information, hereinafter referred to as "post-broadcast integrity information", indicating that a sufficient trust can be placed in a correctness of the correction information received at the first point in time; and,
after the post-broadcast integrity information has been received, which indicates that a sufficient trust can be placed in the correctness of the correction information received at the first point in time, estimating ambiguities in the carrier phase of the observed signals using the correction information received at the first point in time, or, if ambiguities had already been estimated, using the estimated ambiguities or using the positioning solution computed based thereon.

8. Method for conditionally forwarding information, hereinafter referred to as "correction information", suitable for correcting observations useful for estimating at least one of: carrier phase ambiguities and a position of at least one global or regional navigation satellite system receiver, hereinafter abbreviated as NSS receiver, the method comprising:
receiving, at a first point in time, correction information comprising at least one of:
satellite orbit correction information,
satellite clock correction information,
ionospheric correction information, and
tropospheric correction information;
refraining from forwarding the correction information at least until receiving, at a second point in time after the first point in time, information, hereinafter referred to as "post-broadcast integrity information", indicating that a sufficient trust can be placed in a correctness of the correction information received at the first point in time; and,
after the post-broadcast integrity information has been received, which indicates that a sufficient trust can be placed in the correctness of the correction information received at the first point in time, forwarding the correction information received at the first point in time.

9. Method of claim 8, carried out by an apparatus or system having no NSS receiver.

10. Method, carried out by a computer or set of computers, hereinafter collectively referred to as "processing center", for generating information, hereinafter referred to as "correction information", suitable for correcting observations useful for estimating at least one of: carrier phase ambiguities and a position of at least one global or regional navigation satellite system receiver, hereinafter abbreviated as NSS receiver, and for generating further information, hereinafter referred to as "integrity information", suitable for indicating a trust which can be placed in a correctness of the correction information, the method comprising:
generating correction information based on NSS multiple-frequency signals observed at a network of reference stations, each of the reference stations having a NSS receiver, and based on estimating ambiguities in the carrier phase of the NSS signals observed at the network of reference stations, wherein the generated correction information comprises at least one of:
satellite orbit correction information,
satellite clock correction information,
ionospheric correction information, and
tropospheric correction information;

broadcasting, at a first point in time, the correction information;

generating integrity information, hereinafter referred to as "post-broadcast integrity information", wherein generating the post-broadcast integrity information comprises comparing residuals generated based on at least:
- NSS signals observed at each of at least one monitoring station,
- ambiguities in the carrier phase of the NSS signals observed at the at least one monitoring station, estimated using the broadcasted correction information received at each of the at least one monitoring station,
- a known position, hereinafter referred to as "reference position", of each of the at least one monitoring station, and
- the broadcasted correction information received at each of the at least one monitoring station;

with quality indicators of the correction information received at each of the at least one monitoring station; and broadcasting, at a second point in time after the first point in time, the post-broadcast integrity information.

* * * * *